(12) United States Patent
Shimizu et al.

(10) Patent No.: US 11,296,220 B2
(45) Date of Patent: Apr. 5, 2022

(54) SEMICONDUCTOR DEVICE, POWER SUPPLY CIRCUIT, AND COMPUTER

(71) Applicant: KABUSHIKI KAISHA TOSHIBA, Minato-ku (JP)

(72) Inventors: Tatsuo Shimizu, Shinagawa (JP); Yukio Nakabayashi, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 79 days.

(21) Appl. No.: 17/002,828

(22) Filed: Aug. 26, 2020

(65) Prior Publication Data

US 2021/0288175 A1 Sep. 16, 2021

(30) Foreign Application Priority Data

Mar. 13, 2020 (JP) .............................. JP2020-044568

(51) Int. Cl.
*H01L 29/78* (2006.01)
*H01L 29/20* (2006.01)

(52) U.S. Cl.
CPC ...... *H01L 29/7813* (2013.01); *H01L 29/2003* (2013.01)

(58) Field of Classification Search
CPC .................. H01L 29/7813; H01L 29/2003
USPC ........................................................... 257/76
See application file for complete search history.

(56) References Cited

U.S. PATENT DOCUMENTS

| | | | |
|---|---|---|---|
| 8,698,198 B2 | 4/2014 | Kuraguchi | |
| 9,142,636 B2 | 9/2015 | Sheppard et al. | |
| 2013/0181226 A1 | 7/2013 | Saitoh et al. | |
| 2016/0043209 A1 | 2/2016 | Oyama | |
| 2018/0308950 A1 | 10/2018 | Shimizu et al. | |
| 2019/0019680 A1* | 1/2019 | Takeuchi | H01L 21/0262 |
| 2020/0220001 A1* | 7/2020 | Shimizu | H01L 29/0623 |
| 2020/0220008 A1* | 7/2020 | Takeuchi | H01L 29/1608 |

FOREIGN PATENT DOCUMENTS

| | | |
|---|---|---|
| JP | 2008-103617 A | 5/2008 |
| JP | 2008-227356 A | 9/2008 |
| JP | 2014-003301 A | 1/2014 |
| JP | 2014-207287 A | 10/2014 |
| JP | 2018-186127 A | 11/2018 |
| WO | WO 2012/056770 A1 | 5/2012 |

* cited by examiner

*Primary Examiner* — Igwe U Anya

(74) *Attorney, Agent, or Firm* — Oblon, McClelland, Maier & Neustadt, L.L.P.

(57) ABSTRACT

A semiconductor device of an embodiment includes: a nitride semiconductor layer including a first GaN region of n-type, a second GaN region of n-type on the first GaN region, a third GaN region of p-type on the first GaN region, a fourth GaN region of p-type sandwiching the second GaN region with the third GaN region, a fifth GaN region of p-type on the third GaN region, a sixth GaN region of p-type sandwiching the second GaN region with the fifth GaN region, a seventh GaN region of n-type on the fifth GaN region, an eighth GaN region of n-type on the sixth GaN region, a trench between the seventh GaN region and the eighth GaN region, the trench having an inclination angle of less than 90 degrees; a gate insulating layer including an aluminum nitride film in the trench; a gate electrode; a first electrode; and a second electrode.

20 Claims, 12 Drawing Sheets

SEMICONDUCTOR DEVICE, POWER SUPPLY CIRCUIT, AND COMPUTER

CROSS-REFERENCE TO RELATED APPLICATION

This application is based upon and claims the benefit of priority from Japanese Patent Application No. 2020-044568, filed on Mar. 13, 2020, the entire contents of which are incorporated herein by reference.

FIELD

Embodiments described herein relate generally to a semiconductor device, a power supply circuit, and a computer.

BACKGROUND

Semiconductor devices such as transistors and diodes are used for circuits such as switching power supply circuits and inverter circuits. These semiconductor devices are required to have high breakdown voltage and low on-resistance. A relationship between the breakdown voltage and the on-resistance has a trade-off relationship determined by a semiconductor material used for the semiconductor devices.

Silicon is the semiconductor material now widely used for the semiconductor devices. In order to further improve the breakdown voltage and further reduce the on-resistance, it is necessary to change the semiconductor material from silicon to other material. By using a nitride semiconductor such as gallium nitride as the semiconductor material of the semiconductor devices, the trade-off relationship determined by the semiconductor material can be improved. Therefore, it is possible to dramatically increase the breakdown voltage of the semiconductor devices and to dramatically reduce the on-resistance of the semiconductor devices.

In order to reduce the on-resistance, a transistor with a vertical trench gate structure in which a gate electrode is provided in a trench has been studied. In the transistor with the trench gate structure, an electric field is concentrated on a gate insulating layer at a bottom of the trench, so that reliability of the gate insulating layer becomes a concern.

DETAILED DESCRIPTION

Figure 1:
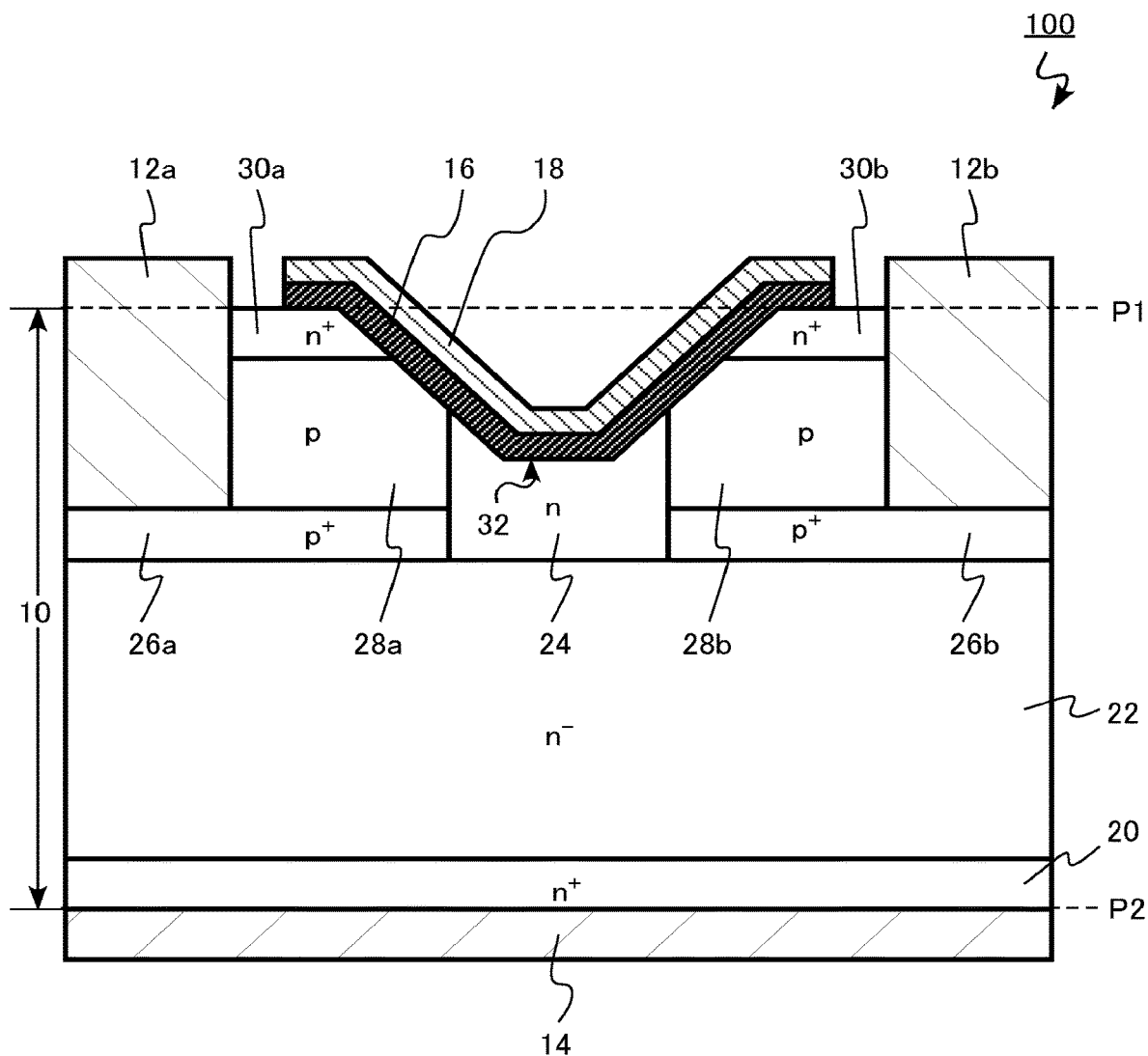
FIG. 1 is a schematic cross-sectional view of a semiconductor device of a first embodiment.

A semiconductor device of an embodiment includes: a nitride semiconductor layer having a first plane and a second plane facing the first plane, the nitride semiconductor layer including a first gallium nitride region of n-type, a second gallium nitride region of n-type disposed between the first gallium nitride region and the first plane, a third gallium nitride region of p-type disposed between the first gallium nitride region and the first plane, a fourth gallium nitride region of p-type disposed between the first gallium nitride region and the first plane, the second gallium nitride region being interposed between the third gallium nitride region and the fourth gallium nitride region, a fifth gallium nitride region of p-type disposed between the third gallium nitride region and the first plane, the fifth gallium nitride region having a p-type impurity concentration lower than a p-type impurity concentration of the third gallium nitride region, a sixth gallium nitride region of p-type disposed between the fourth gallium nitride region and the first plane, the second gallium nitride region being interposed between the fifth gallium nitride region and the sixth gallium nitride region, and the sixth gallium nitride region having a p-type impurity concentration lower than a p-type impurity concentration of the fourth gallium nitride region, a seventh gallium nitride region of n-type disposed between the fifth gallium nitride region and the first plane, an eighth gallium nitride region of n-type disposed between the sixth gallium nitride region and the first plane, and a trench disposed between the seventh gallium nitride region and the eighth gallium nitride region, a depth of the trench being shallower than a depth of the third gallium nitride region and a depth of the fourth gallium nitride region with respect to the first plane, and the trench having side surfaces with an inclination angle of less than 90 degrees with respect to the first plane; a gate insulating layer disposed in the trench, the gate insulating layer including an aluminum nitride film; a gate electrode disposed in the trench, the gate insulating layer being interposed between the gate electrode and the nitride semiconductor layer; a first electrode disposed on a first plane side of the nitride semiconductor layer, the first electrode being in contact with the third gallium nitride region, the fourth gallium nitride region, the seventh gallium nitride region, and the eighth gallium nitride region; and a second electrode disposed on a second plane side of the nitride semiconductor layer.

Hereinafter, embodiments of the present disclosure will be described with reference to the drawings. In the following description, the same or similar members will be denoted by the same reference numerals, and a description of members once described may be omitted.

In this specification, "nitride semiconductor" includes "GaN-based semiconductor". "GaN-based semiconductor" is a general term for semiconductors including gallium nitride (GaN), aluminum nitride (AlN), indium nitride (InN), and intermediate compositions of these compounds.

In this specification, in order to illustrate a positional relationship between components and the like, an upward direction of the drawings may be described as "upper", and a downward direction of the drawings may be described as "lower". In this specification, the terms "upper" and "lower" are not necessarily terms indicating relationships with the direction of gravity.

Further, in the following description, when there is a notation of $n^+$, n, $n^-$ and $p^+$, p, $p^-$, each indicates a relative level of an impurity concentration in each conductivity type. That is, $n^+$ indicates being relatively higher than n in n-type impurity concentration, and $n^-$ indicates being relatively lower than n in n-type impurity concentration. Moreover, $p^+$ indicates being relatively higher than p in p-type impurity concentration, and $p^-$ indicates being relatively lower than p in p-type impurity concentration. In some cases, $n^+$-type and $n^-$-type may be simply referred to as n-type, and $p^|$-type and p-type may be simply referred to as p-type. Unless otherwise specified, the impurity concentration of each region is represented by, for example, a value of an impurity concentration at the center of each region.

Kinds of elements contained in constituent elements of the semiconductor device or concentrations of the elements are measurable by, for example, secondary ion mass spectrometry (SIMS) or energy dispersive X-ray spectroscopy (EDX). Moreover, relative levels of the element concentrations are also determinable from levels of carrier concentrations determined by, for example, scanning capacitance microscopy (SCM). Further, distances such as depth, thickness, width and interval in the semiconductor device are obtainable by SIMS, for example. Moreover, distances such as depth, thickness, width and interval in the semiconductor device are also obtainable from, for example, a comparative image between an SCM image and an atom probe image.

First Embodiment

A semiconductor device of a first embodiment includes: a nitride semiconductor layer having a first plane and a second plane facing the first plane, the nitride semiconductor layer including a first gallium nitride region of n-type, a second gallium nitride region of n-type disposed between the first gallium nitride region and the first plane, a third gallium nitride region of p-type disposed between the first gallium nitride region and the first plane, a fourth gallium nitride region of p-type disposed between the first gallium nitride region and the first plane, the fourth gallium nitride region of p-type sandwiching the second gallium nitride region with the third gallium nitride region, a fifth gallium nitride region of p-type disposed between the third gallium nitride region and the first plane, the fifth gallium nitride region of p-type having a lower p-type impurity concentration than the third gallium nitride region, a sixth gallium nitride region of p-type disposed between the fourth gallium nitride region and the first plane, the sixth gallium nitride region of p-type sandwiching the second gallium nitride region with the fifth gallium nitride region, and the sixth gallium nitride region of p-type having a lower p-type impurity concentration than the fourth gallium nitride region, a seventh gallium nitride region of n-type disposed between the fifth gallium nitride region and the first plane, an eighth gallium nitride region of n-type disposed between the sixth gallium nitride region and the first plane, and a trench disposed between the seventh gallium nitride region and the eighth gallium nitride region, the trench having a depth shallower than a depth of the third gallium nitride region and the fourth gallium nitride region with respect to the first plane, and the trench having side surfaces with an inclination angle of less than 90 degrees with respect to the first plane; a gate insulating layer disposed in the trench, the gate insulating layer including an aluminum nitride film; a gate electrode disposed in the trench, the gate electrode sandwiching the gate insulating layer with the nitride semiconductor layer; a first electrode disposed on the first plane side of the nitride semiconductor layer, the first electrode being in contact with the third gallium nitride region, the fourth gallium nitride region, the seventh gallium nitride region, and the eighth gallium nitride region; and a second electrode disposed on the second plane side of the nitride semiconductor layer.

Figure 2:
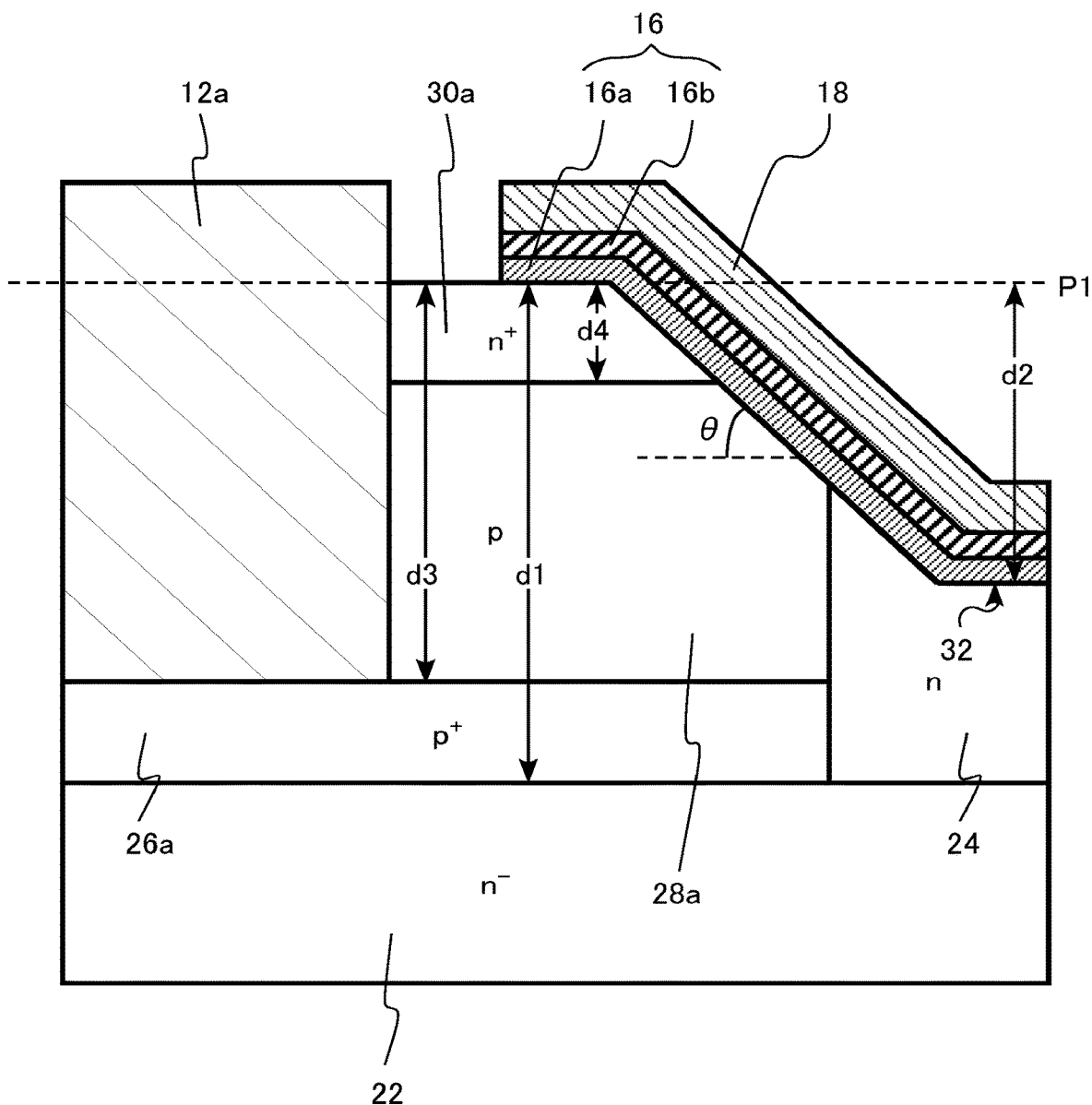
FIG. 2 is an enlarged schematic cross-sectional view of a part of the semiconductor device of the first embodiment.

FIG. 1 is a schematic cross-sectional view of the semiconductor device of the first embodiment. FIG. 2 is an enlarged schematic cross-sectional view of a part of the semiconductor device of the first embodiment. FIG. 2 is an enlarged view of a part of FIG. 1.

The semiconductor device of the first embodiment is a high electron mobility transistor (HEMT) 100 having a MIS structure using a GaN-based semiconductor. The HEMT 100 is a vertical transistor having electrodes on and under a nitride semiconductor layer. The HEMT 100 includes a trench gate structure in which a gate electrode is provided in a trench.

The HEMT 100 includes a nitride semiconductor layer 10, a first source electrode 12a (first electrode), a second source electrode 12b (first electrode), a drain electrode 14 (second electrode), a gate insulating layer 16, and a gate electrode 18. The gate insulating layer 16 includes an aluminum nitride film 16a and a silicon oxide film 16b (insulating film).

The nitride semiconductor layer 10 includes a drain region 20, a drift region 22 (first gallium nitride region), a JFET region 24 (second gallium nitride region), a first electric field relaxation region 26a (third gallium nitride region), a second electric field relaxation region 26b (fourth gallium nitride region), a first base region 28a (fifth gallium nitride region), a second base region 28b (sixth gallium nitride region), a first source region 30a (seventh gallium nitride region), a second source region 30b (eighth gallium nitride region), and a trench 32.

The nitride semiconductor layer 10 has a first plane P1 and a second plane P2. The first plane P1 and the second plane P2 face each other. The first plane P1 is a plane including surfaces of the first source region 30a and the second source region 30b.

The first plane P1 of the nitride semiconductor layer 10 is, for example, a (0001) plane, that is, a gallium plane.

The nitride semiconductor layer 10 is formed of gallium nitride (GaN). The nitride semiconductor layer 10 is a single crystal of gallium nitride.

The drain region 20 is provided on the second plane P2 side of the nitride semiconductor layer 10. The drain region 20 is gallium nitride of $n^+$-type.

The drain region 20 contains, for example, silicon (Si) as an n-type impurity. An n-type impurity concentration of the drain region 20 is, for example, $1\times10^{18}$ $cm^{-3}$ or more and $1\times10^{22}$ $cm^{-3}$ or less.

The drift region 22 is provided between the drain region 20 and the first plane P1. The drift region 22 is gallium nitride of $n^-$-type. The drift region 22 contains, for example, silicon (Si) as an n-type impurity.

An n-type impurity concentration of the drift region 22 is lower than the n-type impurity concentration of the drain region 20. The drift region 22 has a higher resistivity than the drain region 20. The n-type impurity concentration of the drift region 22 is, for example, $1\times10^{16}$ $cm^{-3}$ or more and $1\times10^{18}$ $cm^{-3}$ or less.

The JFET region 24 is provided between the drift region 22 and the first plane P1. The JFET region 24 is provided on the drift region 22. The JFET region 24 is gallium nitride of n⁻-type. The JFET region 24 contains, for example, silicon (Si) as an n-type impurity.

An n-type impurity concentration of the JFET region 24 is higher than the n-type impurity concentration of the drift region 22, for example. The JFET region 24 has a lower resistivity than the drift region 22, for example. The n-type impurity concentration of the drift region 22 is, for example, $5 \times 10^{16}$ cm$^{-3}$ or more and $1 \times 10^{19}$ cm$^{-3}$ or less.

The first electric field relaxation region 26a is provided between the drift region 22 and the first plane P1. The first electric field relaxation region 26a is gallium nitride of p⁺-type. The first electric field relaxation region 26a contains, for example, magnesium (Mg) as a p-type impurity. A p-type impurity concentration of the first electric field relaxation region 26a is, for example, $1 \times 10^{20}$ cm$^{-3}$ or more and $1 \times 10^{22}$ cm$^{-3}$ or less.

A depth (d1 in FIG. 2) of the first electric field relaxation region 26a with respect to the first plane P1 is, for example, 0.6 µm or more and 1.0 µm or less.

Hereinafter, in this specification, the "depth" means a depth with respect to the first plane P1.

The second electric field relaxation region 26b is provided between the drift region 22 and the first plane P1. The second electric field relaxation region 26b is gallium nitride of p⁺-type.

The second electric field relaxation region 26b is separated from the first electric field relaxation region 26a. A part of the JFET region 24 is interposed between the first electric field relaxation region 26a and the second electric field relaxation region 26b.

The second electric field relaxation region 26b contains, for example, magnesium (Mg) as a p-type impurity. A p-type impurity concentration of the second electric field relaxation region 26b is, for example, $1 \times 10^{20}$ cm$^{-3}$ or more and $1 \times 10^{22}$ cm$^{-3}$ or less.

The depth of the first electric field relaxation region 26a and a depth of the second electric field relaxation region 26b are substantially the same. A depth of the second electric field relaxation region 26b with respect to the first plane P1 is, for example, 0.6 µm or more and 1.0 µm or less.

The first electric field relaxation region 26a and the second electric field relaxation region 26b have a function to reduce a strength of an electric field, which is applied to the gate insulating layer 16, by extending a depletion layer to the JFET region 24 during an off-operation of the HEMT 100.

The first base region 28a is provided between the first electric field relaxation region 26a and the first plane P1. The first base region 28a is gallium nitride of p-type. The first base region 28a contains, for example, magnesium (Mg) as a p-type impurity.

A p-type impurity concentration of the first base region 28a is lower than the p-type impurity concentration of the first electric field relaxation region 26a. The p-type impurity concentration of the first base region 28a is lower than the p-type impurity concentration of the first electric field relaxation region 26a by, for example, one digit or more. The p-type impurity concentration of the first base region 28a is, for example, $5 \times 10^{15}$ cm$^{-3}$ or more and $1 \times 10^{20}$ cm$^{-3}$ or less. The p-type impurity concentration of the first base region 28a is more preferably $1 \times 10^{16}$ cm$^{-3}$ or more and $1 \times 10^{19}$ cm$^{-3}$ or less.

The second base region 28b is provided between the second electric field relaxation region 26b and the first plane P1. The second base region 28b is separated from the first base region 28a.

The second base region 28b is gallium nitride of p-type. The second base region 28b contains, for example, magnesium (Mg) as a p-type impurity.

A p-type impurity concentration of the second base region 28b is lower than the p-type impurity concentration of the second electric field relaxation region 26b. The p-type impurity concentration of the second base region 28b is lower than the p-type impurity concentration of the second electric field relaxation region 26b by, for example, one digit or more. The p-type impurity concentration of the second base region 28b is, for example, $5 \times 10^{15}$ cm$^{-3}$ or more and $1 \times 10^{20}$ cm$^{-3}$ or less. The p-type impurity concentration of the second base region 28b is more preferably $1 \times 10^{16}$ cm$^{-3}$ or more and $1 \times 10^{19}$ cm$^{-3}$ or less.

The first base region 28a and the second base region 28b function as channel regions through which electrons flow during an on-operation of the HEMT 100.

The first source region 30a is provided between the first base region 28a and the first plane P1. The first source region 30a is gallium nitride of n⁺-type.

The first source region 30a contains, for example, silicon (Si) as an n-type impurity. An n-type impurity concentration of the first source region 30a is higher than an n-type impurity concentration of the drift region 22, for example. The n-type impurity concentration of the first source region 30a is, for example, $1 \times 10^{18}$ cm$^{-3}$ or more and $1 \times 10^{22}$ cm$^{-3}$ or less.

The second source region 30b is provided between the second base region 28b and the first plane P1. The second source region 30b is separated from the first source region 30a. The second source region 30b is gallium nitride of n⁺-type.

The second source region 30b contains, for example, silicon (Si) as an n-type impurity. An n-type impurity concentration of the second source region 30b is higher than the n-type impurity concentration of the drift region 22, for example. The n-type impurity concentration of the second source region 30b is, for example, $1 \times 10^{18}$ cm$^{-3}$ or more and $1 \times 10^{22}$ cm$^{-3}$ or less.

The first source region 30a and the second source region 30b function as electron supply sources during the on-operation of the HEMT 100.

The trench 32 is formed on the first plane P1 side of the nitride semiconductor layer 10. The trench 32 is a recess formed in the nitride semiconductor layer 10. The trench 32 is a part of the nitride semiconductor layer 10.

The trench 32 is interposed between the first source region 30a and the second source region 30b. The trench 32 is interposed between the first base region 28a and the second base region 28b.

A depth (d2 in FIG. 2) of the trench 32 is shallower than a depth (d1 in FIG. 2) of the first electric field relaxation region 26a. The depth (d2 in FIG. 2) of the trench 32 is shallower than a depth of the second electric field relaxation region 26b. The depth (d2 in FIG. 2) of the trench 32 is, for example, shallower by 0.1 µm or more than the depths of the first electric field relaxation region 26a and the second electric field relaxation region 26b.

The depth (d2 in FIG. 2) of the trench 32 is, for example, shallower than the depth (d3 in FIG. 2) of the first base region 28a. The depth (d2 in FIG. 2) of the trench 32 is shallower than the depth of the second base region 28b, for example.

The depth (d2 in FIG. 2) of the trench 32 is deeper than a depth (d4 in FIG. 2) of the first source region 30a. The depth (d2 in FIG. 2) of the trench 32 is deeper than a depth of the second source region 30b, for example.

A bottom surface of the trench 32 is disposed in the JFET region 24.

Side surfaces of the trench 32 have a forward tapered shape. The side surfaces of the trench 32 are inclined with respect to the first plane P1. An inclination angle (θ in FIG. 2) of the side surfaces of the trench 32 with respect to the first plane P1 is less than 90 degrees. The inclination angle (θ in FIG. 2) of the side surfaces of the trench 32 with respect to the first plane P1 is, for example, 20 degrees or more and 70 degrees or less.

The gate insulating layer 16 is provided in the trench 32. The gate insulating layer 16 is provided between the nitride semiconductor layer 10 and the gate electrode 18.

The gate insulating layer 16 includes the aluminum nitride film 16a and the silicon oxide film 16b. The silicon oxide film 16b is provided between the aluminum nitride film 16a and the gate electrode 18. The silicon oxide film 16b is an example of an insulating film having a chemical composition different from that of the aluminum nitride film 16a. The silicon oxide film 16b is an amorphous film.

The aluminum nitride film 16a is in contact with the JFET region 24, the first base region 28a, the second base region 28b, the first source region 30a, and the second source region 30b. The aluminum nitride film 16a is a crystalline film.

A heterojunction interface is formed between the aluminum nitride film 16a and the nitride semiconductor layer 10. A band gap of aluminum nitride is wider than that of gallium nitride. Two dimensional electron gas (2 DEG) is formed at an interface between the aluminum nitride film 16a and the nitride semiconductor layer 10 that is gallium nitride. The two dimensional electron gas (2 DEG) becomes a carrier of the HEMT 100.

A thickness of the aluminum nitride film 16a is, for example, 10 nm or more and 100 nm or less. The thickness of the silicon oxide film 16b is, for example, 10 nm or more and 100 nm or less. An $SiO_2$ converted film thickness (equivalent oxide thickness) of the gate insulating layer 16 is, for example, 10 nm or more and 100 nm or less. The $SiO_2$ converted film thickness (equivalent oxide thickness) of the gate insulating layer 16 is preferably 10 nm or more and 50 nm or less.

The gate electrode 18 is provided in the trench 32. The gate insulating layer 16 is interposed between the gate electrode 18 and the nitride semiconductor layer 10. The gate electrode 18 is provided on the gate insulating layer 16.

The gate electrode 18 is, for example, a metal or a semiconductor. The gate electrode 18 is, for example, titanium (Ti), titanium nitride (TiN), or polycrystalline silicon.

The first source electrode 12a is provided on the first plane P1 side of the nitride semiconductor layer 10. The first source electrode 12a is in contact with the first electric field relaxation region 26a and the first source region 30a. The first source electrode 12a is electrically connected to the first electric field relaxation region 26a and the first source region 30a. An ohmic connection is established between the first source electrode 12a and the first electric field relaxation region 26a, and between the first source electrode 12a and the first source region 30a.

The second source electrode 12b is provided on the first plane P1 side of the nitride semiconductor layer 10. The second source electrode 12b is in contact with the second electric field relaxation region 26b and the second source region 30b. The second source electrode 12b is electrically connected to the second electric field relaxation region 26b and the second source region 30b. An ohmic connection is established between the second source electrode 12b and the second electric field relaxation region 26b, and between the second source electrode 12b and the second source region 30b.

The first source electrode 12a and the second source electrode 12b are electrically connected to each other. The first source electrode 12a and the second source electrode 12b may be physically connected to each other.

The first source electrode 12a and the second source electrode 12b are, for example, metals. The first source electrode 12a and the second source electrode 12b have, for example, a stacked structure of titanium (Ti) and aluminum (Al).

The drain electrode 14 is provided on the second plane P2 side of the nitride semiconductor layer 10. The drain electrode 14 is in contact with the drain region 20. An ohmic connection is established between the drain electrode 14 and the drain region 20.

The drain electrode 14 is, for example, a metal. The drain electrode 14 has, for example, a stacked structure of titanium (Ti) and aluminum (Al).

During the off-operation of the HEMT 100, there disappears the two dimensional electron gas in a portion where the first base region of p-type 28a is in contact with the gate insulating layer 16 and a portion where the second base region of p-type 28b is in contact with the gate insulating layer 16. Therefore, the HEMT 100 that performs a normally-off operation is achieved.

During the on-operation of the HEMT 100, channels are formed in the portion where the first base region of p-type type 28a is in contact with the gate insulating layer 16 and the portion where the second base region of p-type 28b is in contact with the gate insulating layer 16. Electrons flow from the first source electrode 12a to the drain electrode 14 through the first source region 30a, the first base region 28a, the JFET region 24, the drift region 22, and the drain region 20. Likewise, electrons flow from the second source electrode 12b to the drain electrode 14 through the second source region 30b, the second base region 28b, the JFET region 24, the drift region 22, and the drain region 20.

During the on-operation of the HEMT 100, a current flows from the drain region 20 to the first source electrode 12a and the second source electrode 12b.

Next, a description will be given of an example of a method for manufacturing the semiconductor device of the first embodiment. FIGS. 3, 4, 5 and 6 are schematic cross-sectional views illustrating the method for manufacturing the semiconductor device of the first embodiment.

Figure 3:
FIG. 3 is a schematic cross-sectional view illustrating a method for manufacturing the semiconductor device of the first embodiment.

First, the nitride semiconductor layer 10 is prepared (FIG. 3). The nitride semiconductor layer 10 has the first plane P1 and the second plane P2.

In the nitride semiconductor layer 10, on a gallium nitride substrate of $n^+$-type 50, there are formed a first gallium nitride film of $n^-$-type 51, a second gallium nitride film of $p^+$-type 52, a third gallium nitride film of p-type 53, and a fourth gallium nitride film of $n^+$-type 54. The first gallium nitride film 51, the second gallium nitride film 52, the third gallium nitride film 53, and the fourth gallium nitride film 54 are formed on the gallium nitride substrate 50 by epitaxial growth.

The gallium nitride substrate of $n^+$-type 50 finally becomes the drain region 20 of the HEMT 100. The second gallium nitride film of $p^+$-type 52 finally becomes the first electric field relaxation region 26a and second electric field relaxation region 26b of the HEMT 100. The third gallium nitride film of p-type 53 finally becomes the first base region 28a and second base region 28b of the HEMT 100. Further, the fourth gallium nitride film of n$^+$-type 54 finally becomes the first source region 30*a* and second source region 30*b* of the HEMT 100.

Next, a first mask material 60 is formed on the first plane P1 of the nitride semiconductor layer 10. The first mask material 60 is, for example, silicon oxide.

Figure 4:
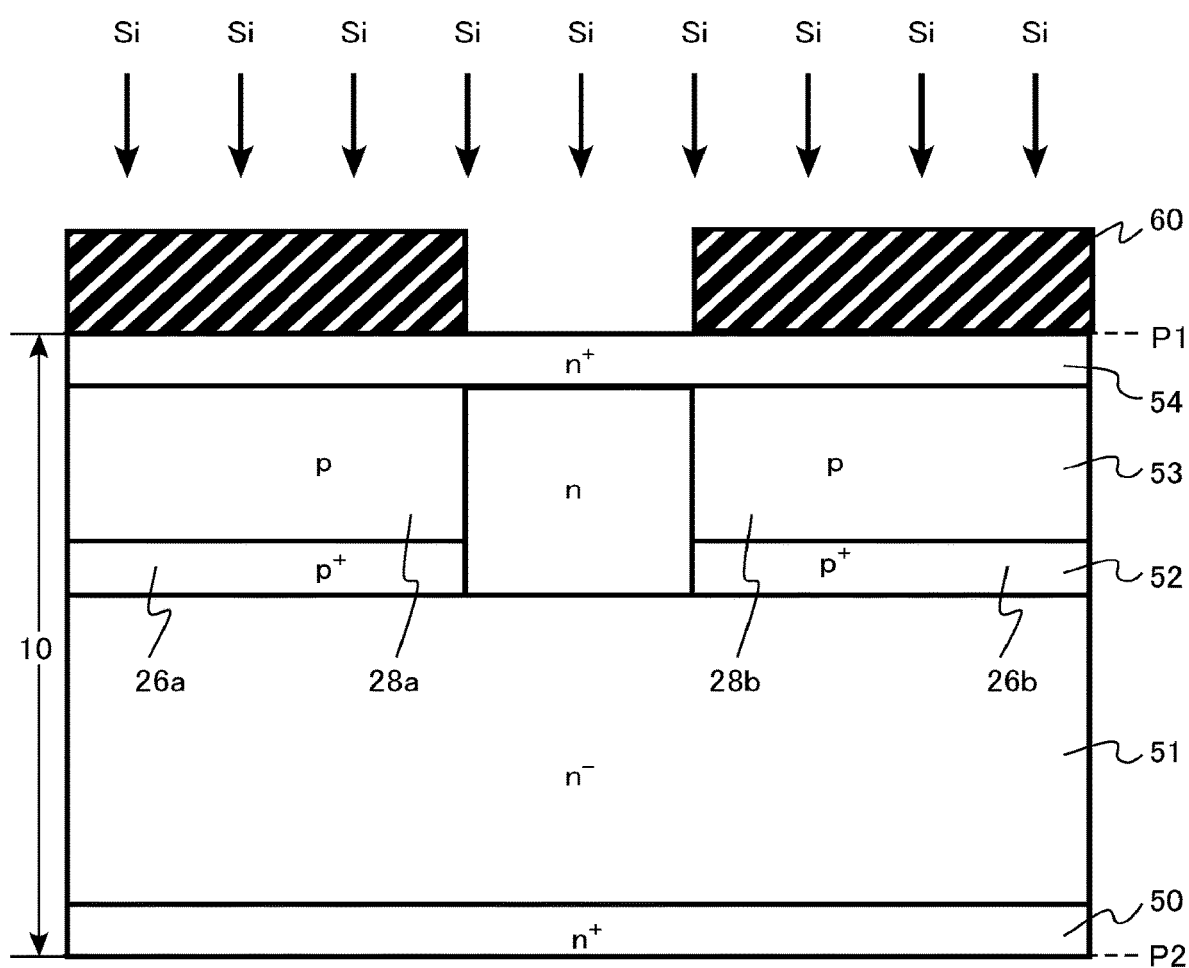
FIG. 4 is a schematic cross-sectional view illustrating the method for manufacturing the semiconductor device of the first embodiment.

Next, silicon (Si) is ion-implanted into the nitride semiconductor layer 10 using the first mask material 60 as a mask (FIG. 4). Silicon is an n-type impurity.

An accelerating voltage of the ion implantation is set so that the silicon reaches a position beyond the second gallium nitride film of p$^+$-type 52. Further, a dose amount is set so that the second gallium nitride film of p$^+$-type 52 into which the silicon is introduced is changed to the n-type.

The JFET region of n-type 24 is formed by the ion implantation of the silicon. The second gallium nitride film of p$^+$-type 52 is divided by the JFET region 24, and the first electric field relaxation region 26*a* and the second electric field relaxation region 26*b* are formed. The third gallium nitride film of p-type 53 is divided by the JFET region 24, and the first base region 28*a* and the second base region 28*b* are formed.

After removing the first mask material 60, a second mask material 62 is formed on the first plane P1 of the nitride semiconductor layer 10. The second mask material 62 is, for example, silicon oxide.

Figure 5:
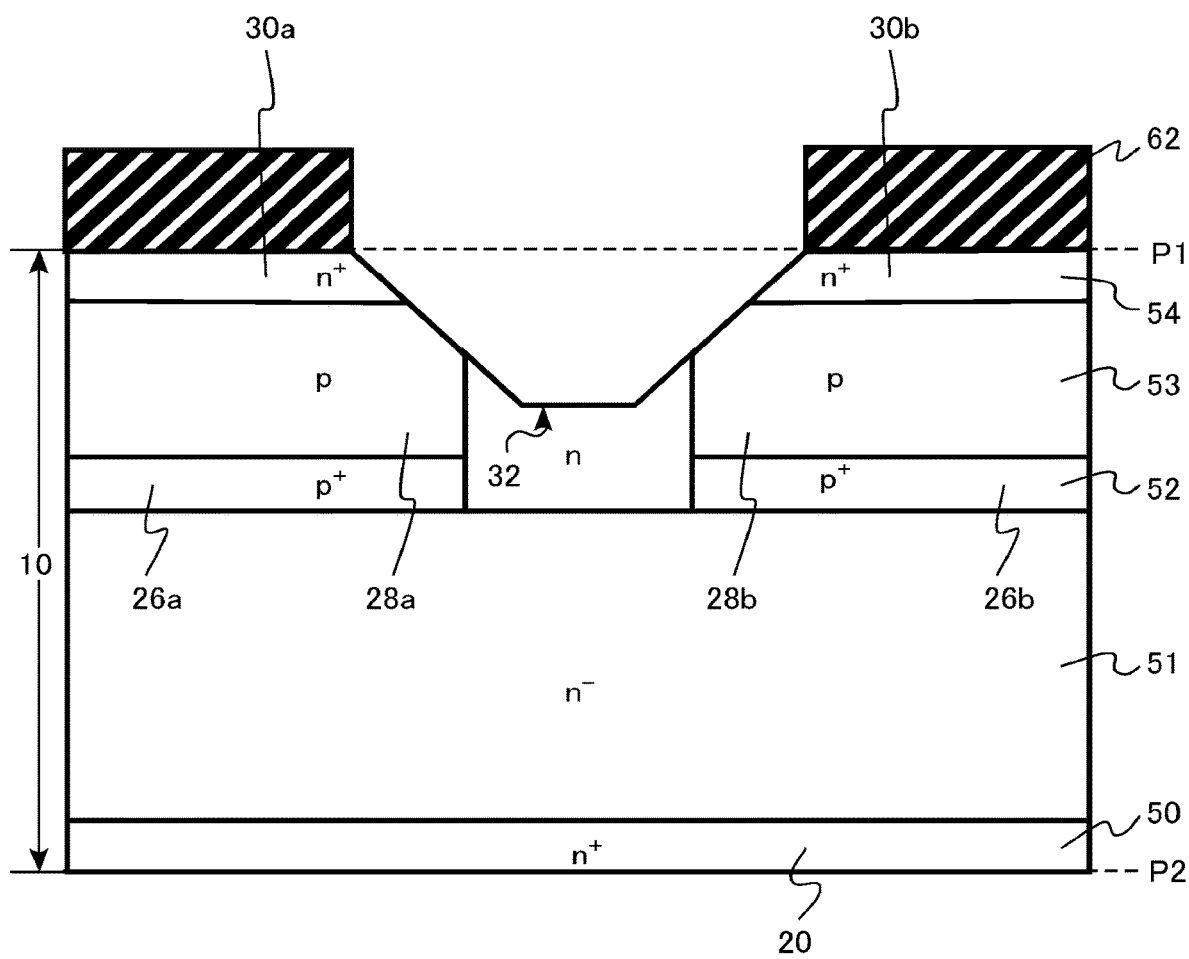
FIG. 5 is a schematic cross-sectional view illustrating the method for manufacturing the semiconductor device of the first embodiment.

Next, a trench 32 is formed using the second mask material 62 as a mask (FIG. 5). The trench 32 is formed by, for example, a reactive ion etching method (RIE method).

The trench 32 is formed so that the side surfaces of the trench 32 have a forward tapered shape. The trench 32 is formed so that the depth of the trench 32 does not exceed a depth of the second gallium nitride film of p$^+$-type 52.

The fourth gallium nitride film of n$^+$-type 54 is divided by the trench 32, and the first source region 30*a* and the second source region 30*b* are formed.

Figure 6:
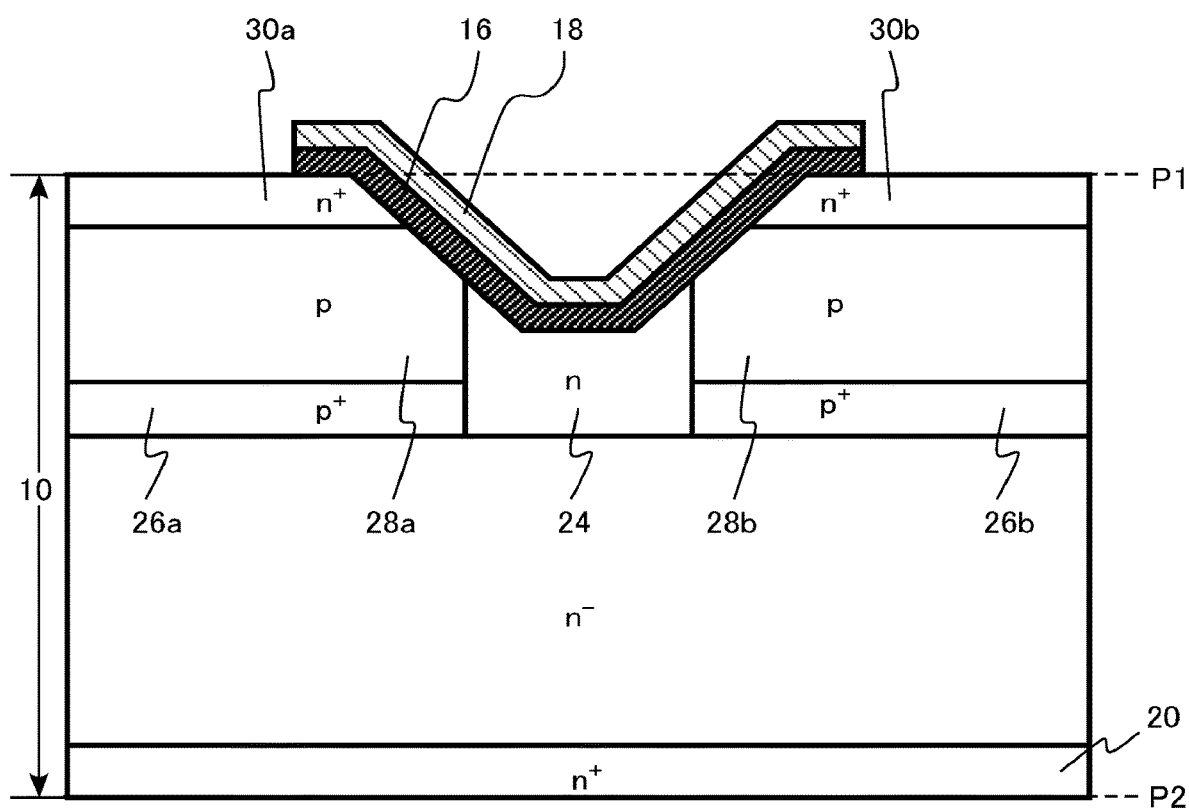
FIG. 6 is a schematic cross-sectional view illustrating the method for manufacturing the semiconductor device of the first embodiment.

After removing the second mask material 62, the gate insulating layer 16 and the gate electrode 18 are formed in the trench 32 (FIG. 6).

First, the aluminum nitride film 16*a* of the gate insulating layer 16 is formed. The aluminum nitride film 16*a* is formed by, for example, an atomic layer deposition method (ALD method). Next, the silicon oxide film 16*b* is formed on the aluminum nitride film 16*a*. The silicon oxide film 16*b* is formed by, for example, a chemical vapor deposition method (CVD method). Then, a heat treatment for crystallizing the aluminum nitride film 16*a* is performed.

The heat treatment for the crystallization is, for example, annealing in a hydrogen atmosphere at 600° C. or higher and 1050° C. or lower. By this annealing, it becomes possible to form the crystalline aluminum nitride film 16*a* having a thickness exceeding a limit due to a large lattice constant difference between the gallium nitride and the aluminum nitride film 16*a*. That is, even if a misfit of the lattice constant occurs, it is possible to form the crystalline aluminum nitride film 16*a* thicker than the conventional one. If there is no hydrogen in the atmosphere, a large amount of misfit defects run and a large amount of interface defects occur when a film thickness of the aluminum nitride film 16*a* is 10 nm or more. However, by the annealing in the hydrogen atmosphere, the crystalline aluminum nitride film 16*a* that is thick is formed while maintaining a lattice strain.

Following the annealing in the hydrogen atmosphere, for example, N$_2$O annealing or NO annealing at 600° C. or higher and 900° C. or lower is performed. In the N$_2$O annealing or the NO annealing, there are effects as follows. Nitrogen and oxygen are dissociated at an interface between the aluminum nitride film 16*a* and the silicon oxide film 16*b*, nitrogen deficiency on the film side of the aluminum nitride film 16*a* is filled with nitrogen, and oxygen deficiency in the silicon oxide film 16*b* is filled with oxygen. This is a new phenomenon that occurred at the nitride film/oxide film interface and was found by a first principle calculation. As a result, crystallinity of the aluminum nitride film 16*a* is greatly improved, and the amorphous silicon oxide film 16*b* is densified. The improvement of the crystallinity of the aluminum nitride film 16*a* is important for expressing a sufficient two dimensional electron gas.

Next, the gate electrode 18 is formed on the gate insulating layer 16. The gate electrode 18 is formed by, for example, a CVD method or a sputtering method.

Next, the first source electrode 12*a*, the second source electrode 12*b*, and the drain electrode 14 are formed using a known process technology. Before forming the drain electrode 14, the thickness of the gallium nitride substrate of n$^+$-type 50 may be reduced by, for example, back grinding.

The HEMT 100 illustrated in FIG. 1 is formed by the above manufacturing method.

Next, functions and effects of the semiconductor device of the first embodiment will be described.

In order to reduce the on-resistance, a transistor with a vertical trench gate structure in which a gate electrode is provided in a trench has been studied. By adopting the trench gate structure, a channel region per unit area of a semiconductor chip increases, and the on-resistance decreases.

In the transistor with the trench gate structure, an electric field is concentrated on a gate insulating layer at a bottom of the trench, so that reliability of the gate insulating layer becomes a concern.

The HEMT 100 of the first embodiment includes the first electric field relaxation region 26*a* and the second electric field relaxation region 26*b* on both sides of the trench 32.

During the off-operation of the HEMT 100, the depletion layer extends from the first electric field relaxation region 26*a* and the second electric field relaxation region 26*b* to the JFET region 24. Hence, the strength of the electric field applied to the gate insulating layer 16 decreases. In particular, a strength of an electric field applied to the gate insulating layer 16 disposed at bottom corners of the trench 32 decreases. Therefore, the reliability of the gate insulating layer 16 is improved.

The depth (d2 in FIG. 2) of the trench 32 is shallower than the depth (d1 in FIG. 2) of the first electric field relaxation region 26*a*. The depth (d2 in FIG. 2) of the trench 32 is shallower than the depth of the second electric field relaxation region 26*b*.

From a viewpoint of reducing the strength of the electric field applied to the gate insulating layer 16, the depth (d2 in FIG. 2) of the trench 32 is shallower than the depths of the first electric field relaxation region 26*a* and the second electric field relaxation region 26*b*, for example, preferably 0.1 μm or more, more preferably 0.2 μm or more.

From the viewpoint of reducing the strength of the electric field applied to the gate insulating layer 16, the depth (d2 in FIG. 2) of the trench 32 is preferably shallower than the depth (d3 in FIG. 2) of the first base region 28*a*. Further, the depth (d2 in FIG. 2) of the trench 32 is preferably shallower than the depth of the second base region 28*b*.

From the viewpoint of reducing the strength of the electric field applied to the gate insulating layer 16, the p-type impurity concentrations of the first electric field relaxation region 26*a* and the second electric field relaxation region 26b are preferably $1\times10^{20}$ cm$^{-3}$ or more, more preferably $5\times10^{20}$ cm$^3$ or more, still more preferably $1\times10^{21}$ cm$^{-3}$ or more.

From a viewpoint of increasing an angle of the bottom corners of the trench 32 and reducing the strength of the electric field applied to the gate insulating layer 16, an inclination angle (θ in FIG. 2) of the side surfaces of the trench 32 with respect to the first plane P1 is preferably 70 degrees or less, more preferably 60 degrees or less, still more preferably 50 degrees or less.

When the inclination angle (θ in FIG. 2) of the side surfaces of the trench 32 with respect to the first plane P1 increases, a polarization amount at the heterojunction interface decreases, and a density of the two dimensional electron gas decreases. Hence, the on-resistance increases. From a viewpoint of increasing the density of the two dimensional electron gas and reducing the on-resistance, the inclination angle (θ in FIG. 2) of the side surfaces of the trench 32 with respect to the first plane P1 is preferably 70 degrees or less, more preferably 60 degrees or less, still more preferably 50 degrees or less.

Meanwhile, when the inclination angle (θ in FIG. 2) of the side surfaces of the trench 32 with respect to the first plane P1 decreases, the channel region per unit area of the semiconductor chip decreases, and the on-resistance increases. From a viewpoint of increasing the channel region per unit area and reducing the on-resistance, the inclination angle (θ in FIG. 2) of the side surfaces of the trench 32 with respect to the first plane P1 is preferably 20 degrees or more, more preferably 30 degrees or more, still more preferably 40 degrees or more.

When a resistance of the JFET region 24 becomes low, the on-resistance of the HEMT 100 decreases. From a viewpoint of reducing the on-resistance of the HEMT 100, the n-type impurity concentration of the JFET region 24 is preferably higher than the n-type impurity concentration of the drift region 22.

If the p-type impurity concentration of the first base region 28a and the second base region 28b becomes too high, a threshold voltage of the HEMT 100 becomes too high, which may make the on-operation difficult. From a viewpoint of optimizing the threshold voltage, preferably, the p-type impurity concentration of the first base region 28a is lower than the p-type impurity concentration of the first electric field relaxation region 26a by one digit or more, and the p-type impurity concentration of the second base region 28b is lower than the p-type impurity concentration of the second electric field relaxation region 26b by one digit or more.

The HEMT 100 of the first embodiment includes, as a built-in diode, a pn diode including a pn junction between the drift region 22 and the first electric field relaxation region 26a and the second electric field relaxation region 26b. This pn diode can be caused to function as a freewheel diode. Hence, the HEMT 100 can achieve a semiconductor device in which a transistor and a freewheel diode are integrated into one chip.

In the HEMT 100 of the first embodiment, the nitride semiconductor layer 10 is entirely made of gallium nitride. Hence, the HEMT 100 is easy to manufacture.

The depth of the first electric field relaxation region 26a and the second electric field relaxation region 26b with respect to the first plane P1 is preferably 1 μm or less. When the HEMT 100 is manufactured, it becomes easy to divide the second gallium nitride film of p$^+$-type 52 by the JFET region 24 and form the first electric field relaxation region 26a and the second electric field relaxation region 26b. If the depth of the first electric field relaxation region 26a and the second electric field relaxation region 26b with respect to the first plane P1 is too deep, it becomes difficult to divide the second gallium nitride film 52 by the ion implantation of silicon.

As described above, according to the first embodiment, a semiconductor device in which the reliability of the gate insulating layer is improved can be achieved.

Second Embodiment

A semiconductor device of a second embodiment is different from the semiconductor device of the first embodiment in that the nitride semiconductor layer includes a ninth gallium nitride region of n-type disposed between the first gallium nitride region and the third gallium nitride region, and between the first gallium nitride region and the fourth gallium nitride region, the ninth gallium nitride region of n-type having a higher n-type impurity concentration than the first gallium nitride region. Hereinafter, a description of the same contents as those in the first embodiment will be partially omitted.

Figure 7:
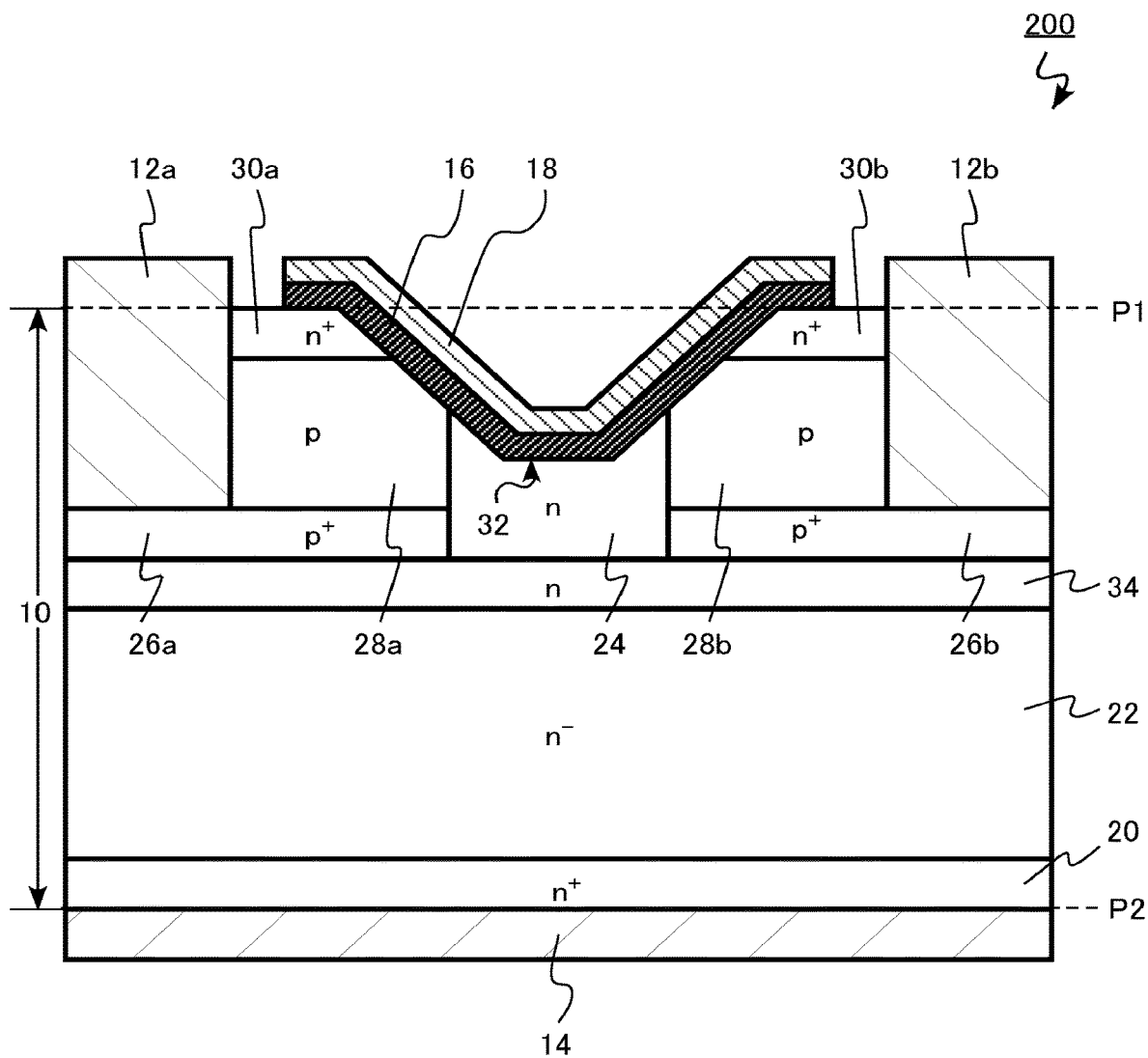
FIG. 7 is a schematic cross-sectional view of a semiconductor device of a second embodiment.

FIG. 7 is a schematic cross-sectional view of the semiconductor device of the second embodiment.

The semiconductor device of the second embodiment is a HEMT 200 with a MIS structure using a GaN-based semiconductor. The HEMT 200 is a vertical transistor having electrodes on and under a nitride semiconductor layer. The HEMT 200 includes a trench gate structure in which a gate electrode is provided in a trench.

The HEMT 200 includes a nitride semiconductor layer 10, a first source electrode 12a (first electrode), a second source electrode 12b (first electrode), a drain electrode 14 (second electrode), a gate insulating layer 16, and a gate electrode 18. The gate insulating layer 16 includes an aluminum nitride film 16a and a silicon oxide film 16b (insulating film).

The nitride semiconductor layer 10 includes a drain region 20, a drift region 22 (first gallium nitride region), a JFET region 24 (second gallium nitride region), a first electric field relaxation region 26a (third gallium nitride region), a second electric field relaxation region 26b (fourth gallium nitride region), a first base region 28a (fifth gallium nitride region), a second base region 28b (sixth gallium nitride region), a first source region 30a (seventh gallium nitride region), a second source region 30b (eighth gallium nitride region), and a trench 32. The nitride semiconductor layer 10 further includes a CSL region 34 (ninth gallium nitride region).

The CSL region 34 is provided between the drift region 22 and the first electric field relaxation region 26a. The CSL region 34 is provided between the drift region 22 and the second electric field relaxation region 26b.

The CSL region 34 is gallium nitride of n-type. The CSL region 34 contains, for example, silicon (Si) as an n-type impurity.

An n-type impurity concentration of the CSL region 34 is higher than an n-type impurity concentration of the drift region 22. The CSL region 34 has a lower resistivity than the drift region 22. The n-type impurity concentration of the CSL region 34 is, for example, $5\times10^{16}$ cm$^{-3}$ or more and $1\times10^{19}$ cm$^{-3}$ or less.

The CSL region 34 is a so-called charge spreading layer. During an on-operation of the HEMT 200, electrons traveling from the JFET region 24 toward the drift region 22 spread laterally in the low-resistance CSL region 34. Hence, the on-resistance of HEMT 200 decreases.

As described above, according to the second embodiment, a semiconductor device in which the reliability of the gate insulating layer is improved can be achieved. Further, a semiconductor device in which the on-resistance decreases can be achieved.

Third Embodiment

A semiconductor device of a third embodiment is different from the semiconductor device of the first embodiment in that the nitride semiconductor layer includes a tenth gallium nitride region of p-type disposed between the third gallium nitride region and the fourth gallium nitride region, the tenth gallium nitride region of p-type being in contact with the third gallium nitride region and the fourth gallium nitride region. Hereinafter, a description of the same contents as those in the first embodiment will be partially omitted.

Figure 8:
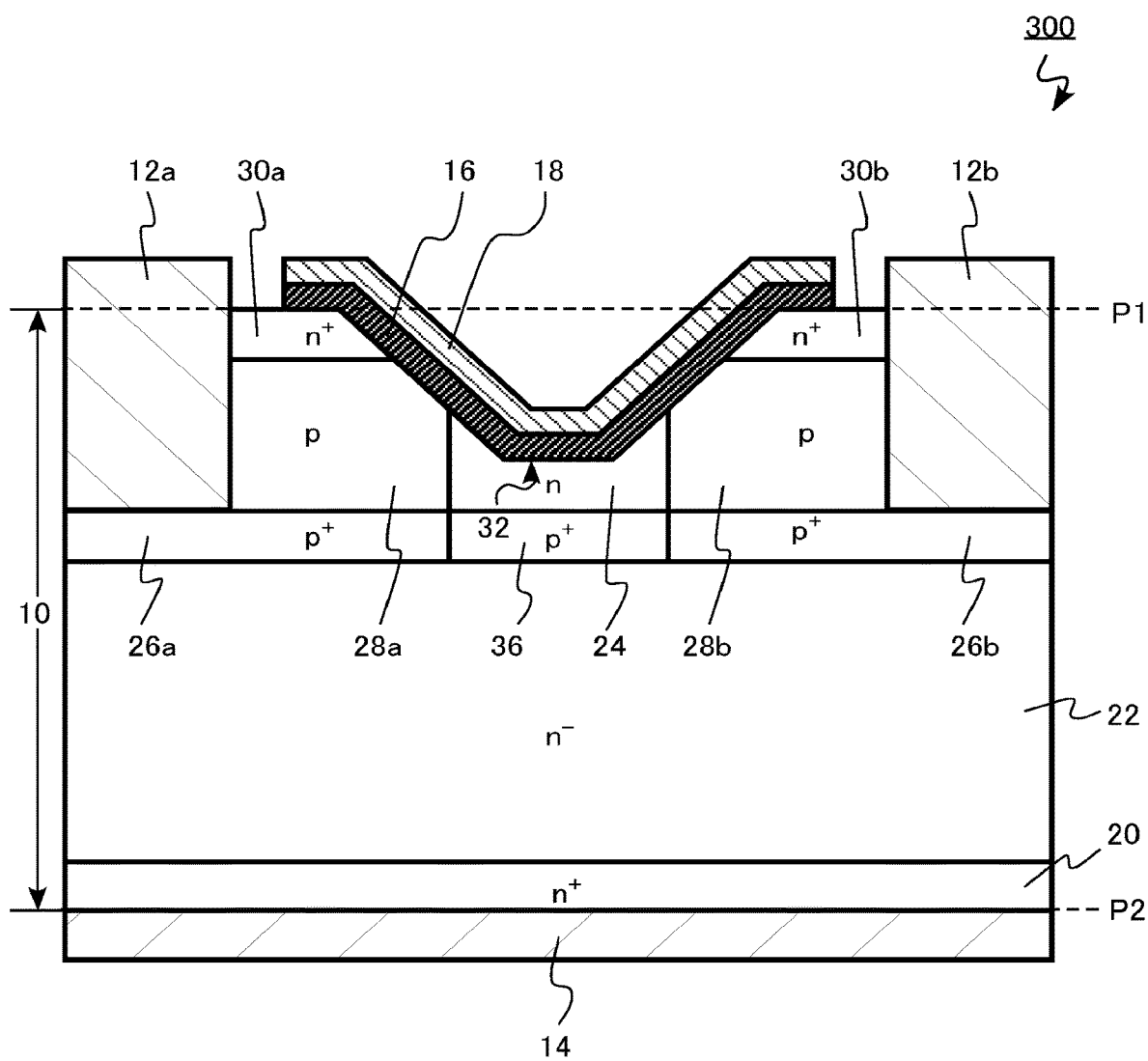
FIG. 8 is a schematic cross-sectional view of a semiconductor device of a third embodiment.

FIG. 8 is a schematic cross-sectional view of the semiconductor device of the third embodiment.

The semiconductor device of the third embodiment is a HEMT 300 with a MIS structure using a GaN-based semiconductor. The HEMT 300 is a vertical transistor having electrodes on and under a nitride semiconductor layer. The HEMT 300 includes a trench gate structure in which a gate electrode is provided in a trench.

The HEMT 300 includes a nitride semiconductor layer 10, a first source electrode 12a (first electrode), a second source electrode 12b (first electrode), a drain electrode 14 (second electrode), a gate insulating layer 16, and a gate electrode 18. The gate insulating layer 16 includes an aluminum nitride film 16a and a silicon oxide film 16b (insulating film).

The nitride semiconductor layer 10 includes a drain region 20, a drift region 22 (first gallium nitride region), a JFET region 24 (second gallium nitride region), a first electric field relaxation region 26a (third gallium nitride region), a second electric field relaxation region 26b (fourth gallium nitride region), a first base region 28a (fifth gallium nitride region), a second base region 28b (sixth gallium nitride region), a first source region 30a (seventh gallium nitride region), a second source region 30b (eighth gallium nitride region), and a trench 32. The nitride semiconductor layer 10 further includes connection regions 36 (tenth gallium nitride region).

The connection regions 36 are provided in partial portions between the first electric field relaxation region 26a and the second electric field relaxation region 26b. The connection regions 36 are in contact with the first electric field relaxation region 26a and the second electric field relaxation region 26b.

For example, in a depth direction of a sheet surface of FIG. 8, there are portion where the connection regions 36 are not present between the first electric field relaxation region 26a and the second electric field relaxation region 26b. In other words, in the depth direction of the sheet surface of FIG. 8, the HEMT 300 has a portion having the same cross-sectional structure as that of FIG. 1. The connection regions 36 are repeatedly arranged in the depth direction of the sheet surface of FIG. 8 with such JFET regions 24 interposed therebetween.

By providing the connection regions 36 in the HEMT 300, the depletion layer extends also from the connection regions 36 to the JFET regions 24 during the off-operation. Hence, the strength of the electric field applied to the gate insulating layer 16 further decreases. In particular, the strength of the electric field applied to the gate insulating layer 16 disposed at the bottom corners of the trench 32 further decreases. Therefore, the reliability of the gate insulating layer 16 is further improved.

Further, when a load connected to the HEMT 300 is short-circuited, a large short-circuit current may flow between the drain electrode 14 and the first source electrode 12a and the second source electrode 12b. In the HEMT 300, the JFET regions 24 are narrowed by the connection regions 36 adjacent to one another. Hence, a large short-circuit current is suppressed from flowing. Therefore, a short circuit capacity of the HEMT 300 is improved.

As described above, according to the third embodiment, a semiconductor device in which the reliability of the gate insulating layer is improved can be achieved. Moreover, a semiconductor device in which the short circuit capacity is improved can be achieved.

Fourth Embodiment

A semiconductor device of a fourth embodiment is different from the semiconductor device of the first embodiment in that a first distance between the third gallium nitride region and the fourth gallium nitride region is shorter than a second distance between the fifth gallium nitride region and the sixth gallium nitride region. Hereinafter, a description of the same contents as those in the first embodiment will be partially omitted.

Figure 9:
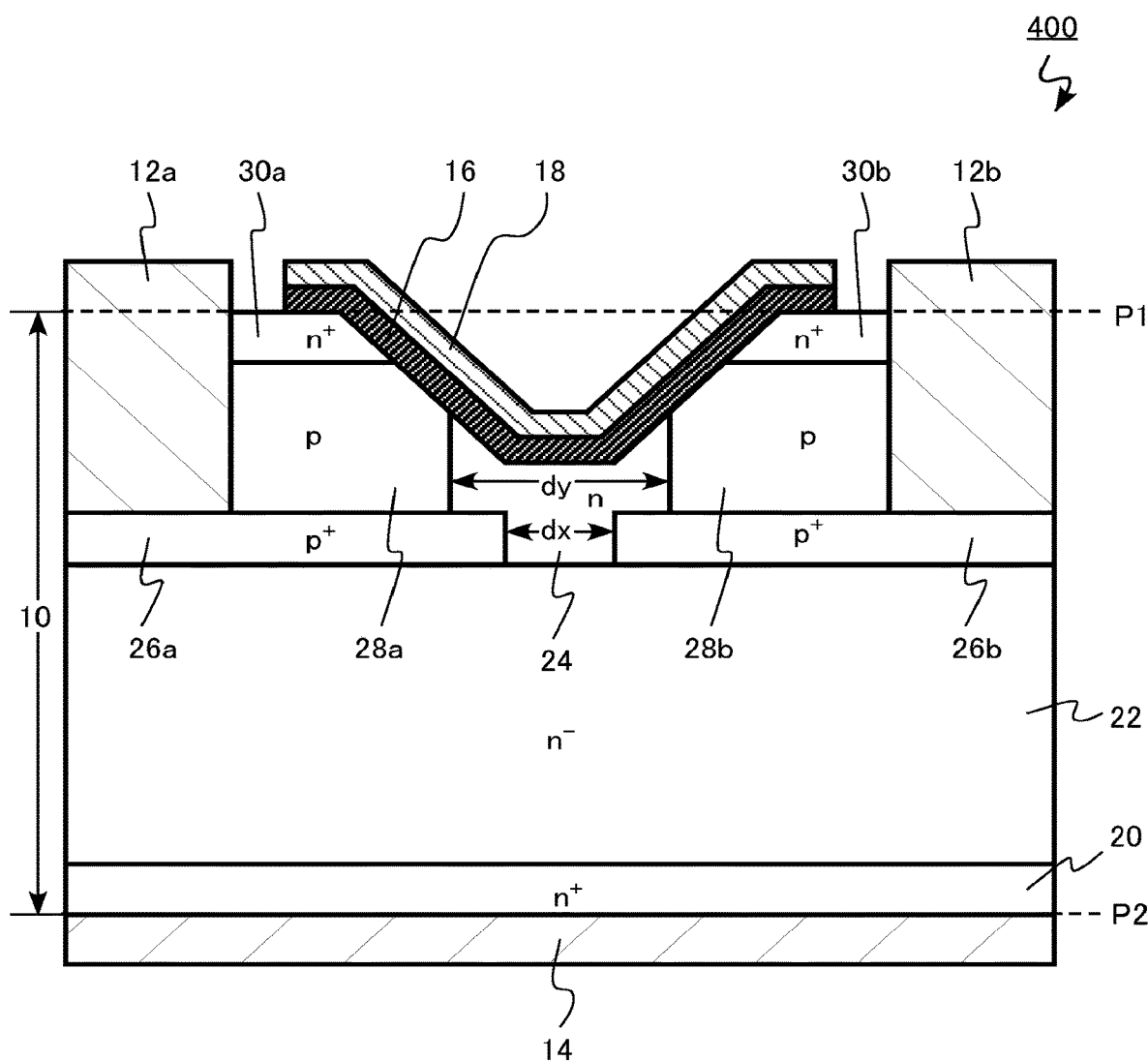
FIG. 9 is a schematic cross-sectional view of a semiconductor device of a fourth embodiment.

FIG. 9 is a schematic cross-sectional view of the semiconductor device of the fourth embodiment.

The semiconductor device of the fourth embodiment is a HEMT 400 with a MIS structure using a GaN-based semiconductor. The HEMT 400 is a vertical transistor having electrodes on and under a nitride semiconductor layer. The HEMT 400 includes a trench gate structure in which a gate electrode is provided in a trench.

The HEMT 400 includes a nitride semiconductor layer 10, a first source electrode 12a (first electrode), a second source electrode 12b (first electrode), a drain electrode 14 (second electrode), a gate insulating layer 16, and a gate electrode 18. The gate insulating layer 16 includes an aluminum nitride film 16a and a silicon oxide film 16b (insulating film).

The nitride semiconductor layer 10 includes a drain region 20, a drift region 22 (first gallium nitride region), a JFET region 24 (second gallium nitride region), a first electric field relaxation region 26a (third gallium nitride region), a second electric field relaxation region 26b (fourth gallium nitride region), a first base region 28a (fifth gallium nitride region), a second base region 28b (sixth gallium nitride region), a first source region 30a (seventh gallium nitride region), a second source region 30b (eighth gallium nitride region), and a trench 32.

A first distance (dx in FIG. 9) between the first electric field relaxation region 26a and the second electric field relaxation region 26b is shorter than a second distance (dy in FIG. 9) between the first base region 28a and the second base region 28b.

In the HEMT 400, the first distance between the first electric field relaxation region 26a and the second electric field relaxation region 26b is shortened, whereby the depletion layer easily extends in the JFET region 24 during the off-operation. Hence, the strength of the electric field applied to the gate insulating layer 16 further decreases. In particular, the strength of the electric field applied to the gate insulating layer 16 disposed at the bottom corners of the trench 32 further decreases. Therefore, the reliability of the gate insulating layer 16 is further improved.

As described above, according to the fourth embodiment, a semiconductor device in which the reliability of the gate insulating layer is improved can be achieved.

Fifth Embodiment

A semiconductor device of a fifth embodiment includes: a nitride semiconductor layer having a first plane and a second plane facing the first plane, the nitride semiconductor layer including a first gallium nitride region of n-type, a second gallium nitride region of n-type disposed between the first gallium nitride region and the first plane, a third gallium nitride region of p-type disposed between the first gallium nitride region and the first plane, the third gallium nitride region of p-type having a p-type impurity concentration of $1\times10^{20}$ cm$^{-3}$ or more, a fourth gallium nitride region of p-type disposed between the first gallium nitride region and the first plane, the fourth gallium nitride region of p-type sandwiching the second gallium nitride region with the third gallium nitride region, and the fourth gallium nitride region of p-type having a p-type impurity concentration of $1\times10^{20}$ cm$^{-3}$ or more, a fifth gallium nitride region of p-type disposed between the third gallium nitride region and the first plane, the fifth gallium nitride region of p-type having a p-type impurity concentration of $1\times10^{20}$ cm$^{-3}$ or more, a sixth gallium nitride region of p-type disposed between the fourth gallium nitride region and the first plane, the sixth gallium nitride region of p-type sandwiching the second gallium nitride region with the fifth gallium nitride region, and the sixth gallium nitride region of p-type having a p-type impurity concentration of $1\times10^{20}$ cm$^{-3}$ or more, a seventh gallium nitride region of n-type disposed between the fifth gallium nitride region and the first plane, an eighth gallium nitride region of n-type disposed between the sixth gallium nitride region and the first plane, and a trench disposed between the seventh gallium nitride region and the eighth gallium nitride region, the trench having a depth shallower than a depth of the third gallium nitride region and the fourth gallium nitride region with respect to the first plane, and the trench having side surfaces with an inclination angle of less than 90 degrees with respect to the first plane; a gate insulating layer disposed in the trench, the gate insulating layer including an aluminum nitride film; a gate electrode disposed in the trench, the gate electrode sandwiching the gate insulating layer with the nitride semiconductor layer; a first electrode disposed on the first plane side of the nitride semiconductor layer, the first electrode being in contact with the third gallium nitride region, the fourth gallium nitride region, the seventh gallium nitride region, and the eighth gallium nitride region; and a second electrode disposed on the second plane side of the nitride semiconductor layer.

The semiconductor device of the fifth embodiment is different from the semiconductor device of the first embodiment in that the fifth gallium nitride region and the sixth gallium nitride region have high p-type impurity concentrations. Hereinafter, a description of the same contents as those in the first embodiment will be partially omitted.

Figure 10:
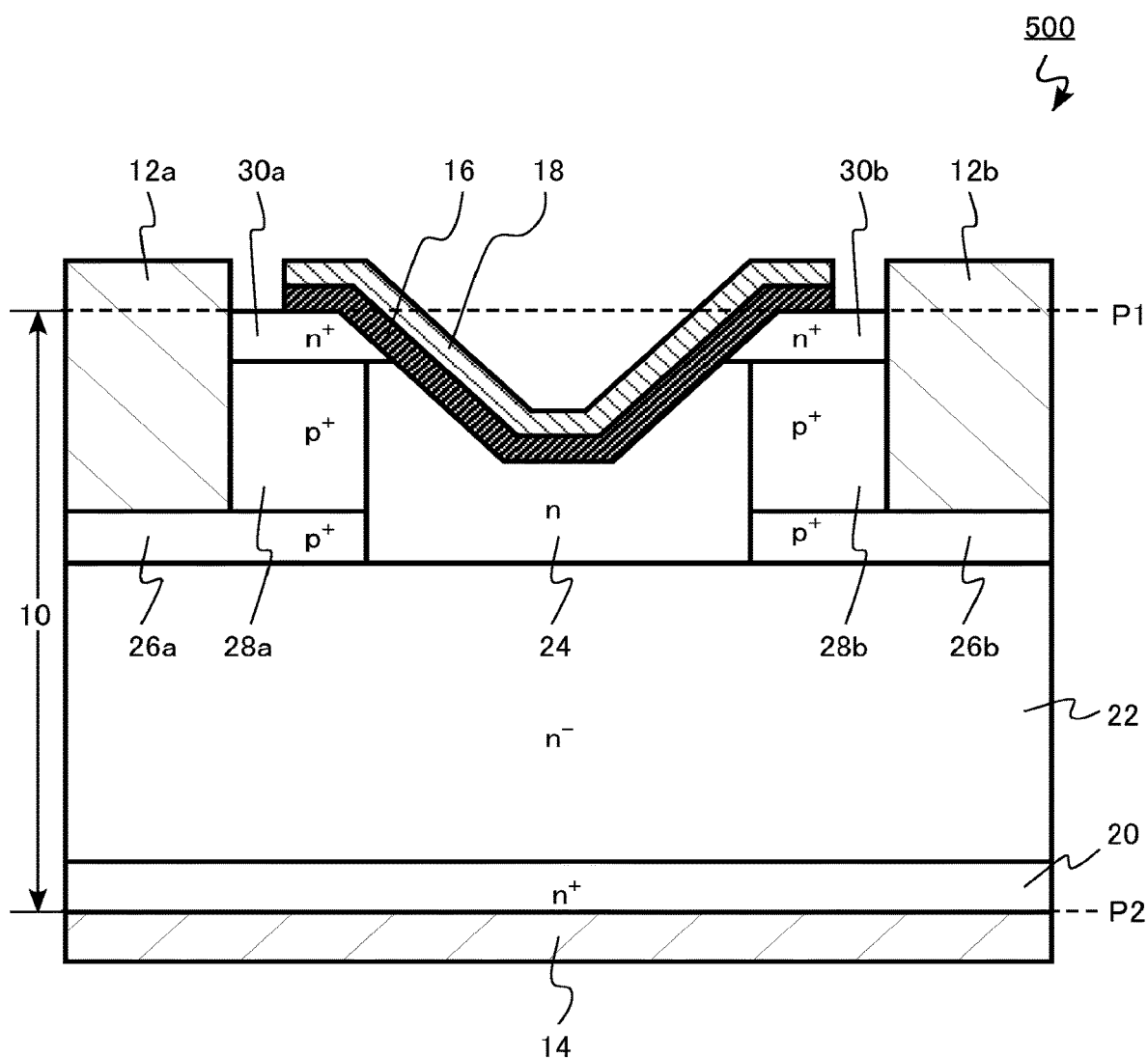
FIG. 10 is a schematic cross-sectional view of a semiconductor device of a fifth embodiment.

FIG. 10 is a schematic cross-sectional view of the semiconductor device of the fifth embodiment.

The semiconductor device of the fifth embodiment is a HEMT 500 with a MIS structure using a GaN-based semiconductor. The HEMT 500 is a vertical transistor having electrodes on and under a nitride semiconductor layer. The HEMT 500 includes a trench gate structure in which a gate electrode is provided in a trench.

The HEMT 500 includes a nitride semiconductor layer 10, a first source electrode 12a (first electrode), a second source electrode 12b (first electrode), a drain electrode 14 (second electrode), a gate insulating layer 16, and a gate electrode 18. The gate insulating layer 16 includes an aluminum nitride film 16a and a silicon oxide film 16b (insulating film).

The nitride semiconductor layer 10 includes a drain region 20, a drift region 22 (first gallium nitride region), a JFET region 24 (second gallium nitride region), a first electric field relaxation region 26a (third gallium nitride region), a second electric field relaxation region 26b (fourth gallium nitride region), a first base region 28a (fifth gallium nitride region), a second base region 28b (sixth gallium nitride region), a first source region 30a (seventh gallium nitride region), a second source region 30b (eighth gallium nitride region), and a trench 32.

The first electric field relaxation region 26a is provided between the drift region 22 and the first plane P1. The first electric field relaxation region 26a is gallium nitride of p$^+$-type. The first electric field relaxation region 26a contains, for example, magnesium (Mg) as a p-type impurity. The p-type impurity concentration of the first electric field relaxation region 26a is $1\times10^{20}$ cm$^{-3}$ or more.

The second electric field relaxation region 26b is provided between the drift region 22 and the first plane P1. The second electric field relaxation region 26b is gallium nitride of p$^+$-type. The second electric field relaxation region 26b contains, for example, magnesium (Mg) as a p-type impurity. The p-type impurity concentration of the second electric field relaxation region 26b is $1\times10^{20}$ cm$^{-3}$ or more.

The first base region 28a is provided between the first electric field relaxation region 26a and the first plane P1. The first base region 28a is gallium nitride of p$^+$-type. The first base region 28a contains, for example, magnesium (Mg) as a p-type impurity.

The p-type impurity concentration of the first base region 28a is, for example, substantially the same as the p-type impurity concentration of the first electric field relaxation region 26a. The p-type impurity concentration of the first electric field relaxation region 28a is $1\times10^{20}$ cm$^{-3}$ or more.

The second base region 28b is provided between the second electric field relaxation region 26b and the first plane P1. The second base region 28b is separated from the first base region 28a.

The second base region 28b is gallium nitride of p$^+$-type. The first base region 28a contains, for example, magnesium (Mg) as a p-type impurity.

The p-type impurity concentration of the second base region 28b is, for example, substantially the same as the p-type impurity concentration of the second electric field relaxation region 26b. The p-type impurity concentration of the second base region 28b is $1\times10^{20}$ cm$^{-3}$ or more.

The first base region 28a and the second base region 28b are separated from the gate insulating layer 16, for example. Even if the first base region 28a and the second base region 28b are separated from the gate insulating layer 16, it becomes possible to increase a threshold voltage of the HEMT 500 by increasing the p-type impurity concentrations of the first base region 28a and the second base region 28b. Even if the p-type region is not in contact with the channel, normally off is achieved by increasing a potential felt by the 2 DEG.

By increasing the p-type impurity concentrations of the first base region 28a and the second base region 28b, the depletion layer easily extends in the JFET region 24 during the off-operation of the HEMT 500. Hence, as compared with the HEMT 100 of the first embodiment, it becomes possible to increase the n-type impurity concentration of the JFET region 24. Therefore, the on-resistance of HEMT 500 is reduced. This is because the increase of the concentration not only lowers a bulk resistance but also increases a 2 DEG density expressed at the interface with the gate insulating layer 16.

For example, the p-type impurity concentrations of the first base region 28a and the second base region 28b are made substantially the same as the p-type impurity concentrations of the first electric field relaxation region 26a and the second electric field relaxation region 26b, whereby it becomes possible to form the first base region 28a and the second base region 28b simultaneously with the first electric field relaxation region 26a and the second electric field relaxation region 26b. Therefore, the HEMT 500 is easily manufactured.

As described above, according to the fifth embodiment, a semiconductor device in which the reliability of the gate insulating layer is improved can be achieved. Moreover, the on-resistance is reduced.

Sixth Embodiment

A semiconductor device of a sixth embodiment includes: a nitride semiconductor layer having a first plane and a second plane facing the first plane, the nitride semiconductor layer including a first gallium nitride region of n-type, a second gallium nitride region of n-type disposed between the first gallium nitride region and the first plane, a third gallium nitride region of p-type disposed between the first gallium nitride region and the first plane, the third gallium nitride region of p-type having a p-type impurity concentration of $1 \times 10^{20}$ cm$^{-3}$ or more, a fourth gallium nitride region of p-type disposed between the first gallium nitride region and the first plane, the fourth gallium nitride region of p-type sandwiching the second gallium nitride region with the third gallium nitride region, and the fourth gallium nitride region of p-type having a p-type impurity concentration of $1 \times 10^{20}$ cm$^{-3}$ or more, a fifth gallium nitride region of n-type disposed between the third gallium nitride region and the first plane, a sixth gallium nitride region of n-type disposed between the fourth gallium nitride region and the first plane, the sixth gallium nitride region of n-type sandwiching the second gallium nitride region with the fifth gallium nitride region, a seventh gallium nitride region of n-type disposed between the fifth gallium nitride region and the first plane, the seventh gallium nitride region of n-type having a higher n-type impurity concentration than the fifth gallium nitride region, an eighth gallium nitride region of n-type disposed between the sixth gallium nitride region and the first plane, the eighth gallium nitride region of n-type having a higher n-type impurity concentration than the sixth gallium nitride region, and a trench disposed between the seventh gallium nitride region and the eighth gallium nitride region, the trench having a depth shallower than a depth of the third gallium nitride region and the fourth gallium nitride region with respect to the first plane, and the trench having side surfaces with an inclination angle of less than 90 degrees with respect to the first plane; a gate insulating layer disposed in the trench, the gate insulating layer including an aluminum nitride film; a gate electrode disposed in the trench, the gate electrode sandwiching the gate insulating layer with the nitride semiconductor layer, and the gate electrode including a nitride semiconductor of p-type; a first electrode disposed on the first plane side of the nitride semiconductor layer, the first electrode being in contact with the third gallium nitride region, the fourth gallium nitride region, the seventh gallium nitride region, and the eighth gallium nitride region; and a second electrode disposed on the second plane side of the nitride semiconductor layer.

The semiconductor device of the sixth embodiment is different from the semiconductor device of the first embodiment in that the fifth gallium nitride region and the sixth gallium nitride region are n-type. Hereinafter, a description of the same contents as those in the first embodiment will be partially omitted.

Figure 11:
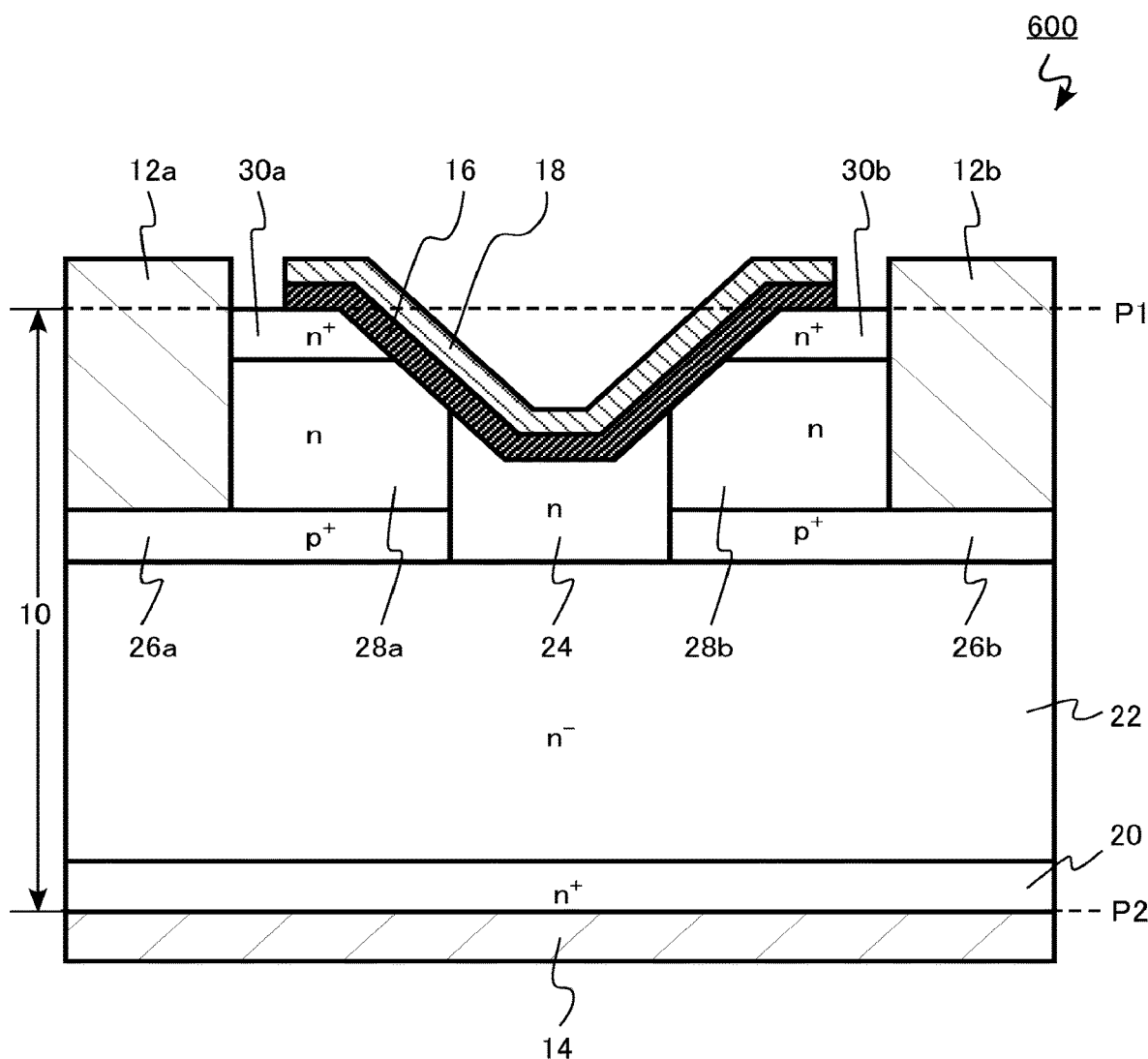
FIG. 11 is a schematic cross-sectional view of a semiconductor device of a sixth embodiment.

FIG. 11 is a schematic cross-sectional view of the semiconductor device of the sixth embodiment.

The semiconductor device of the sixth embodiment is a HEMT 600 with a MIS structure using a GaN-based semiconductor. The HEMT 600 is a vertical transistor having electrodes on and under a nitride semiconductor layer. The HEMT 600 includes a trench gate structure in which a gate electrode is provided in a trench.

The HEMT 600 includes a nitride semiconductor layer 10, a first source electrode 12a (first electrode), a second source electrode 12b (first electrode), a drain electrode 14 (second electrode), a gate insulating layer 16, and a gate electrode 18. The gate insulating layer 16 includes an aluminum nitride film 16a and a silicon oxide film 16b (insulating film).

The nitride semiconductor layer 10 includes a drain region 20, a drift region 22 (first gallium nitride region), a JFET region 24 (second gallium nitride region), a first electric field relaxation region 26a (third gallium nitride region), a second electric field relaxation region 26b (fourth gallium nitride region), a first base region 28a (fifth gallium nitride region), a second base region 28b (sixth gallium nitride region), a first source region 30a (seventh gallium nitride region), a second source region 30b (eighth gallium nitride region), and a trench 32.

The first electric field relaxation region 26a is provided between the drift region 22 and the first plane P1. The first electric field relaxation region 26a is gallium nitride of p$^|$-type. The first electric field relaxation region 26a contains, for example, magnesium (Mg) as a p-type impurity. A p-type impurity concentration of the first electric field relaxation region 26a is, for example, $1 \times 10^{20}$ cm$^{-3}$ or more and $1 \times 10^{22}$ cm$^{-3}$ or less.

The second electric field relaxation region 26b is provided between the drift region 22 and the first plane P1. The second electric field relaxation region 26b is gallium nitride of p$^+$-type.

The second electric field relaxation region 26b is separated from the first electric field relaxation region 26a. A part of the JFET region 24 is interposed between the first electric field relaxation region 26a and the second electric field relaxation region 26b.

The second electric field relaxation region 26b contains, for example, magnesium (Mg) as a p-type impurity. A p-type impurity concentration of the second electric field relaxation region 26b is, for example, $1 \times 10^{20}$ cm$^{-3}$ or more and $1 \times 10^{22}$ cm$^{-3}$ or less.

The first base region 28a is provided between the first electric field relaxation region 26a and the first plane P1. The first base region 28a is gallium nitride of n-type. The first base region 28a contains, for example, silicon (Si) as an n-type impurity. The n-type impurity concentration of the first base region 28a is, for example, $1 \times 10^{18}$ cm$^{-3}$ or more and $1 \times 10^{20}$ cm$^{-3}$ or less.

The second base region 28b is provided between the second electric field relaxation region 26b and the first plane P1. The second base region 28b is separated from the first base region 28a.

The second base region 28b is gallium nitride of n-type. The second base region 28b contains, for example, silicon (Si) as an n-type impurity. The n-type impurity concentration of the second base region 28b is, for example, $1 \times 10^{18}$ cm$^{-3}$ or more and $1 \times 10^{20}$ cm$^{-3}$ or less.

The first base region 28a and the second base region 28b function as channel regions through which electrons flow during an on-operation of the HEMT 600.

The first source region 30a is provided between the first base region 28a and the first plane P1. The first source region 30a is gallium nitride of n$^{+}$-type.

The first source region 30a contains, for example, silicon (Si) as an n-type impurity. An n-type impurity concentration of the first source region 30a is higher than the n-type impurity concentration of the first base region 28a. The n-type impurity concentration of the first source region 30a is, for example, $1 \times 10^{18}$ cm$^{-3}$ or more and $1 \times 10^{22}$ cm$^{-3}$ or less.

The second source region 30b is provided between the second base region 28b and the first plane P1. The second source region 30b is separated from the first source region 30a. The second source region 30b is gallium nitride of n$^{+}$-type.

The second source region 30b contains, for example, silicon (Si) as an n-type impurity. An n-type impurity concentration of the second source region 30b is higher than the n-type impurity concentration of the second base region 28b. The n-type impurity concentration of the second source region 30b is, for example, $1 \times 10^{18}$ cm$^{-3}$ or more and $1 \times 10^{22}$ cm$^{-3}$ or less.

The gate electrode 18 is provided in the trench 32. The gate insulating layer 16 is interposed between the gate electrode 18 and the nitride semiconductor layer 10. The gate electrode 18 is provided on the gate insulating layer 16.

The gate electrode 18 is gallium nitride of p-type. By using gallium nitride of p-type for the gate electrode 18, potentials of the first base region 28a and the second base region 28b can be raised during an off-operation of the HEMT 600. Hence, even if the first base region 28a and the second base region 28b are n-type, the HEMT 600 that performs a normally-off operation can be achieved.

As described above, according to the sixth embodiment, a semiconductor device in which the reliability of the gate insulating layer is improved can be achieved.

Seventh Embodiment

A power supply circuit and computer of a seventh embodiment have the HEMT of any of the first to sixth embodiments.

Figure 12:
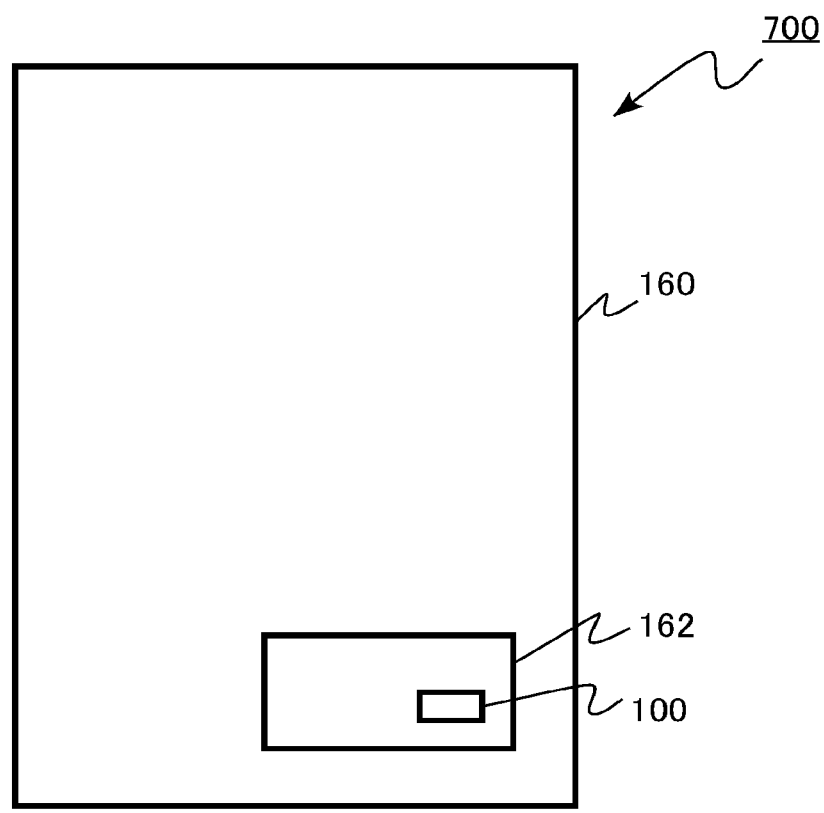
FIG. 12 is a schematic diagram of a computer of a seventh embodiment.

FIG. 12 is a schematic diagram of the computer of the seventh embodiment. The computer of the seventh embodiment is, for example, a server 700.

The server 700 includes a power supply circuit 162 in a housing 160. The server 700 is a computer that runs server software. The power supply circuit 162 includes, for example, the HEMT 100 of the first embodiment.

The power supply circuit 162 includes the HEMT 100 with improved transistor characteristics, thereby achieving stable operations. Further, the server 700 includes the power supply circuit 162, thereby achieving stable operations.

According to the seventh embodiment, a power supply circuit and a computer, which achieve stable operations, can be achieved.

In the first to sixth embodiments, as an example, the description is given of the case where the gate insulating layer 16 includes an insulating film having a chemical composition different from that of the aluminum nitride film 16a; however, the gate insulating layer 16 may be a single layer of the aluminum nitride film 16a.

Further, in the first to sixth embodiments, the description is given of the case where the silicon oxide film 16b is an example of the insulating film having a chemical composition different from that of the aluminum nitride film 16a; however, the insulating film may be a film having another chemical composition or a stacked film of a plurality of films.

While certain embodiments have been described, these embodiments have been presented by way of example only, and are not intended to limit the scope of the inventions. Indeed, the semiconductor devices, the power supply circuit, and the computer, which are described herein, may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a nitride semiconductor layer having a first plane and a second plane facing the first plane, the nitride semiconductor layer including
a first gallium nitride region of n-type,
a second gallium nitride region of n-type disposed between the first gallium nitride region and the first plane,
a third gallium nitride region of p-type disposed between the first gallium nitride region and the first plane,
a fourth gallium nitride region of p-type disposed between the first gallium nitride region and the first plane, the second gallium nitride region being interposed between the third gallium nitride region and the fourth gallium nitride region,
a fifth gallium nitride region of p-type disposed between the third gallium nitride region and the first plane, the fifth gallium nitride region having a p-type impurity concentration lower than a p-type impurity concentration of the third gallium nitride region,
a sixth gallium nitride region of p-type disposed between the fourth gallium nitride region and the first plane, the second gallium nitride region being interposed between the fifth gallium nitride region and the sixth gallium nitride region, and the sixth gallium nitride region having a p-type impurity concentration lower than a p-type impurity concentration of the fourth gallium nitride region,
a seventh gallium nitride region of n-type disposed between the fifth gallium nitride region and the first plane,
an eighth gallium nitride region of n-type disposed between the sixth gallium nitride region and the first plane, and
a trench disposed between the seventh gallium nitride region and the eighth gallium nitride region, a depth of the trench being shallower than a depth of the third gallium nitride region and a depth of the fourth gallium nitride region with respect to the first plane, and the trench having side surfaces with an inclination angle of less than 90 degrees with respect to the first plane;

a gate insulating layer disposed in the trench, the gate insulating layer including an aluminum nitride film;

a gate electrode disposed in the trench, the gate insulating layer being interposed between the gate electrode and the nitride semiconductor layer;

a first electrode disposed on a first plane side of the nitride semiconductor layer, the first electrode being in contact with the third gallium nitride region, the fourth gallium nitride region, the seventh gallium nitride region, and the eighth gallium nitride region; and a second electrode disposed on a second plane side of the nitride semiconductor layer.

2. The semiconductor device according to claim 1, wherein the inclination angle is 20 degrees or more and 70 degrees or less.

3. The semiconductor device according to claim 1, wherein the trench is disposed between the fifth gallium nitride region and the sixth gallium nitride region.

4. The semiconductor device according to claim 1, wherein the depth of the trench with respect to the first plane is shallower than a depth of the fifth gallium nitride region and a depth of the sixth gallium nitride region.

5. The semiconductor device according to claim 1, wherein the aluminum nitride film is in contact with the second gallium nitride region, the fifth gallium nitride region, the sixth gallium nitride region, the seventh gallium nitride region, and the eighth gallium nitride region.

6. The semiconductor device according to claim 1, wherein the gate insulating layer includes an insulating film disposed between the aluminum nitride film and the gate electrode, the insulating film having a chemical composition different from a chemical composition of the aluminum nitride film.

7. The semiconductor device according to claim 1, wherein the nitride semiconductor layer includes a ninth gallium nitride region of n-type disposed between the first gallium nitride region and the third gallium nitride region, and between the first gallium nitride region and the fourth gallium nitride region, the ninth gallium nitride region having a n-type impurity concentration higher than a n-type impurity concentration of the first gallium nitride region.

8. The semiconductor device according to claim 1, wherein the nitride semiconductor layer includes a tenth gallium nitride region of p-type disposed between the third gallium nitride region and the fourth gallium nitride region, the tenth gallium nitride region being in contact with the third gallium nitride region and the fourth gallium nitride region.

9. The semiconductor device according to claim 1, wherein a first distance between the third gallium nitride region and the fourth gallium nitride region is shorter than a second distance between the fifth gallium nitride region and the sixth gallium nitride region.

10. The semiconductor device according to claim 1, wherein an n-type impurity concentration of the second gallium nitride region is higher than an n-type impurity concentration of the first gallium nitride region.

11. The semiconductor device according to claim 1, wherein the depth of the third gallium nitride region and the depth the fourth gallium nitride region with respect to the first plane is 1 μm or less.

12. The semiconductor device according to claim 1, wherein the p-type impurity concentration of the fifth gallium nitride region is lower than the p-type impurity concentration of the third gallium nitride region by one digit or more, and the p-type impurity concentration of the sixth gallium nitride region is lower than the p-type impurity concentration of the fourth gallium nitride region by one digit or more.

13. The semiconductor device according to claim 1, wherein the p-type impurity concentration of the third gallium nitride region and the p-type impurity concentration of the fourth gallium nitride region are $1 \times 10^{20}$ cm$^{-3}$ or more.

14. A power supply circuit comprising the semiconductor device according to claim 1.

15. A computer comprising the semiconductor device according to claim 1.

16. A semiconductor device comprising:

a nitride semiconductor layer having a first plane and a second plane facing the first plane, the nitride semiconductor layer including a first gallium nitride region of n-type, a second gallium nitride region of n-type disposed between the first gallium nitride region and the first plane, a third gallium nitride region of p-type disposed between the first gallium nitride region and the first plane, the third gallium nitride region having a p-type impurity concentration of $1 \times 10^{20}$ cm$^{-3}$ or more, a fourth gallium nitride region of p-type disposed between the first gallium nitride region and the first plane, the second gallium nitride region being interposed between the third gallium nitride region and the fourth gallium nitride region, and the fourth gallium nitride region having a p-type impurity concentration of $1 \times 10^{20}$ cm$^{-3}$ or more, a fifth gallium nitride region of p-type disposed between the third gallium nitride region and the first plane, the fifth gallium nitride region having a p-type impurity concentration of $1 \times 10^{20}$ cm$^{-3}$ or more, a sixth gallium nitride region of p-type disposed between the fourth gallium nitride region and the first plane, the second gallium nitride region being interposed between the fifth gallium nitride region and the sixth gallium nitride region, and the sixth gallium nitride region having a p-type impurity concentration of $1 \times 10^{20}$ cm$^{-3}$ or more, a seventh gallium nitride region of n-type disposed between the fifth gallium nitride region and the first plane, an eighth gallium nitride region of n-type disposed between the sixth gallium nitride region and the first plane, and a trench disposed between the seventh gallium nitride region and the eighth gallium nitride region, a depth of the trench being shallower than a depth of the third gallium nitride region and a depth of the fourth gallium nitride region with respect to the first plane, and the trench having side surfaces with an inclination angle of less than 90 degrees with respect to the first plane;

a gate insulating layer disposed in the trench, the gate insulating layer including an aluminum nitride film;

a gate electrode disposed in the trench, the gate insulating layer interposed between the gate electrode and the nitride semiconductor layer;

a first electrode disposed on a first plane side of the nitride semiconductor layer, the first electrode being in contact with the third gallium nitride region, the fourth gallium nitride region, the seventh gallium nitride region, and the eighth gallium nitride region; and a second electrode disposed on a second plane side of the nitride semiconductor layer.

17. The semiconductor device according to claim 16, wherein the inclination angle is 20 degrees or more and 70 degrees or less.

18. The semiconductor device according to claim 16, wherein the p-type impurity concentrations of the third gallium nitride region, the fourth gallium nitride region, the fifth gallium nitride region, and the sixth gallium nitride region are substantially the same.

19. A semiconductor device comprising:

a nitride semiconductor layer having a first plane and a second plane facing the first plane, the nitride semiconductor layer including a first gallium nitride region of n-type, a second gallium nitride region of n-type disposed between the first gallium nitride region and the first plane, a third gallium nitride region of p-type disposed between the first gallium nitride region and the first plane, the third gallium nitride region having a p-type impurity concentration of $1 \times 10^{20}$ cm$^{-3}$ or more, a fourth gallium nitride region of p-type disposed between the first gallium nitride region and the first plane, the second gallium nitride region being interposed between the third gallium nitride region and the fourth gallium nitride region, and the fourth gallium nitride region having a p-type impurity concentration of $1 \times 10^{20}$ cm$^{-3}$ or more, a fifth gallium nitride region of n-type disposed between the third gallium nitride region and the first plane, a sixth gallium nitride region of n-type disposed between the fourth gallium nitride region and the first plane, the second gallium nitride region being interposed between the fifth gallium nitride region and the sixth gallium nitride region, a seventh gallium nitride region of n-type disposed between the fifth gallium nitride region and the first plane, the seventh gallium nitride region having an n-type impurity concentration higher than an n-type impurity concentration of the fifth gallium nitride region, an eighth gallium nitride region of n-type disposed between the sixth gallium nitride region and the first plane, the eighth gallium nitride region having an n-type impurity concentration higher than an n-type impurity concentration of the sixth gallium nitride region, and a trench disposed between the seventh gallium nitride region and the eighth gallium nitride region, a depth of the trench being shallower than a depth of the third gallium nitride region and a depth of the fourth gallium nitride region with respect to the first plane, and the trench having side surfaces with an inclination angle of less than 90 degrees with respect to the first plane;

a gate insulating layer disposed in the trench, the gate insulating layer including an aluminum nitride film;

a gate electrode disposed in the trench, the gate insulating layer being interposed between the gate electrode and the nitride semiconductor layer, and the gate electrode including a nitride semiconductor of p-type;

a first electrode disposed on a first plane side of the nitride semiconductor layer, the first electrode being in contact with the third gallium nitride region, the fourth gallium nitride region, the seventh gallium nitride region, and the eighth gallium nitride region; and a second electrode disposed on a second plane side of the nitride semiconductor layer.

20. The semiconductor device according to claim 19, wherein the inclination angle is 20 degrees or more and 70 degrees or less.

* * * * *